United States Patent
Ichikawa

(10) Patent No.: US 6,675,000 B1
(45) Date of Patent: Jan. 6, 2004

(54) RADIO COMMUNICATION APPARATUS AND TRANSMISSION POWER CONTROL METHOD THEREIN

(75) Inventor: Yasufumi Ichikawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/468,278

(22) Filed: Dec. 20, 1999

(30) Foreign Application Priority Data

Dec. 25, 1998 (JP) .......................................... 10-371154

(51) Int. Cl.[7] .............................................. H01Q 11/12
(52) U.S. Cl. ............................ 455/127.3; 455/241.1; 455/522; 330/133
(58) Field of Search .............................. 455/522, 127.1, 455/126, 129, 69, 575, 91, 550, 241.1, 251.1, 253.2, 116, 115, 127.2, 127.3; 330/51, 126, 107, 127, 302, 295, 129, 133, 134

(56) References Cited

U.S. PATENT DOCUMENTS

| | | | | |
|---|---|---|---|---|
| 4,439,744 A | * | 3/1984 | Kumar et al. | 330/277 |
| 5,056,109 A | | 10/1991 | Gilhousen et al. | |
| 5,126,688 A | * | 6/1992 | Nakanishi et al. | 330/285 |
| 5,307,512 A | * | 4/1994 | Mitzlaff | 330/144 |
| 5,396,516 A | * | 3/1995 | Padovani et al. | 370/342 |
| 5,590,409 A | * | 12/1996 | Sawahashi et al. | 370/342 |
| 5,604,924 A | * | 2/1997 | Yokoya | 455/68 |
| 5,661,434 A | * | 8/1997 | Brozovich et al. | 330/310 |
| 5,697,073 A | * | 12/1997 | Daniel et al. | 455/126 |
| 5,758,269 A | * | 5/1998 | Wu | 455/115 |
| 5,828,953 A | * | 10/1998 | Kawase | 455/115 |
| 5,841,320 A | * | 11/1998 | Ichihara | 330/133 |
| 5,852,770 A | * | 12/1998 | Kasamatsu | 330/129 |
| 5,943,610 A | * | 8/1999 | Endo | 455/456 |
| 6,075,978 A | * | 6/2000 | Tsumura | 455/234.1 |
| 6,101,373 A | * | 8/2000 | Samuels | 455/115 |
| 6,127,890 A | * | 10/2000 | Shimomura et al. | 330/254 |
| 6,172,567 B1 | * | 1/2001 | Ueno et al. | 330/285 |
| 6,215,987 B1 | * | 4/2001 | Fujita | 455/127.3 |
| 6,389,296 B1 | * | 5/2002 | Shiraki et al. | 370/335 |
| 6,437,643 B1 | * | 8/2002 | Ueno et al. | 330/85 |

FOREIGN PATENT DOCUMENTS

| | | |
|---|---|---|
| CN | 1090107 A | 11/1990 |
| EP | 0 397 401 | 11/1990 |
| EP | 0 546 693 A1 | 6/1993 |
| EP | 0 626 765 A1 | 11/1994 |
| JP | 8-32513 | 2/1996 |

OTHER PUBLICATIONS

WO92/22143, Dec. 1992, Power Control Circuitry for Achieving Wide Dynamic Range in a Transmitter, Inventor: J.E. Mitzlaff.

* cited by examiner

Primary Examiner—Charles Appiah
(74) Attorney, Agent, or Firm—Pearne & Gordon LLP

(57) ABSTRACT

A radio communication apparatus is provided with a first variable power amplifier 13 and a second variable power amplifier 14 in a radio transmission unit 22, and also a variable amplifier 16 is provided at a prestage of a modulation unit 15. A transmission power control bit is extracted from a reception signal sent from a communication counter station by a variable power amplifying-controlling unit 18. The variable power amplifying-controlling unit 18 updates a value of transmission power stored in an own station based upon the value of this extracted transmission power control bit, and also compares the updated transmission value with a predetermined threshold value. Based upon this comparison result, the first and second variable power amplifier 13 and 14, and the variable amplifier 16 are controlled in either a serial control manner or a parallel control manner so as to perform a variable power amplification, so that the own transmission power is adjusted.

18 Claims, 19 Drawing Sheets

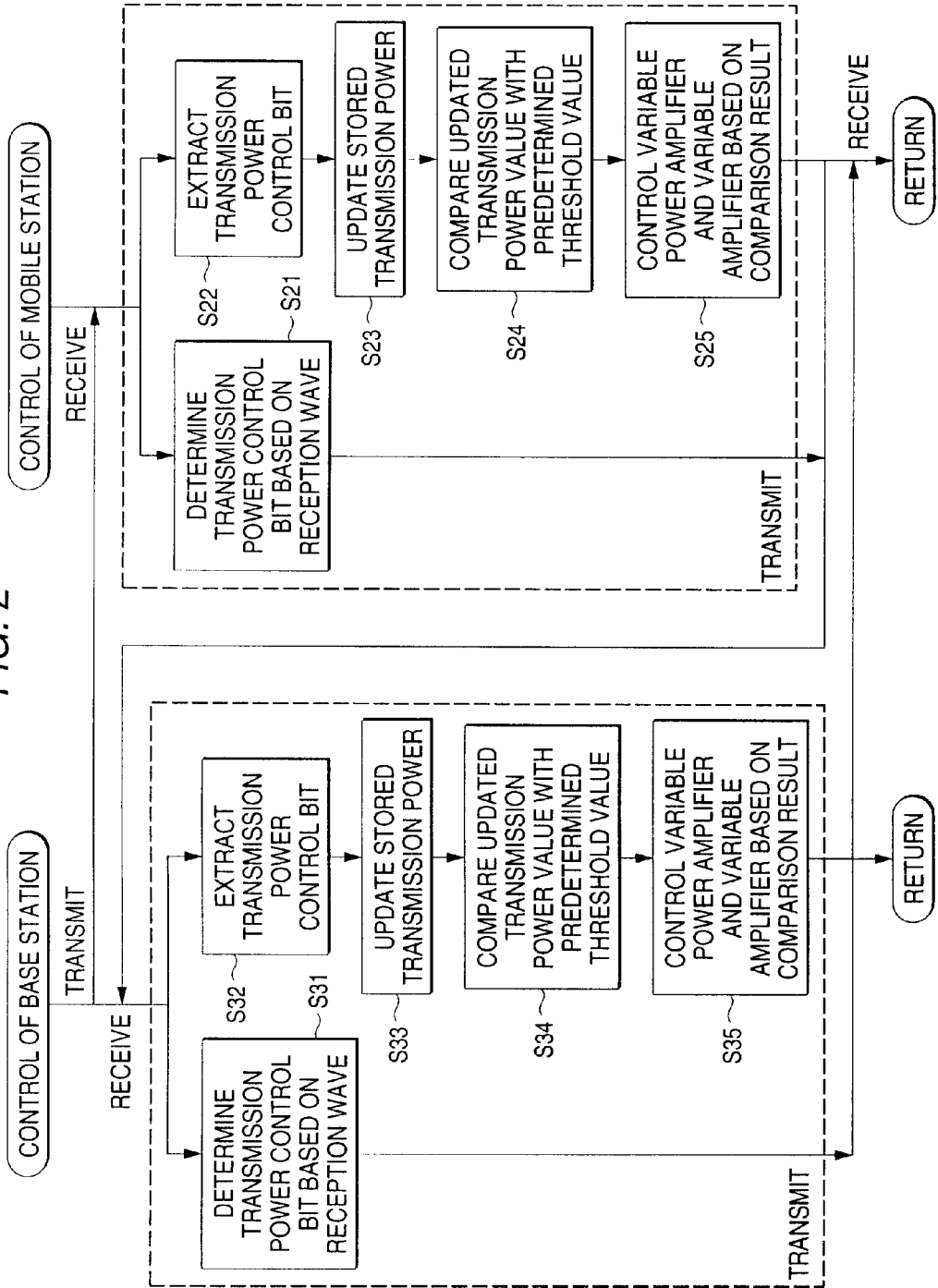

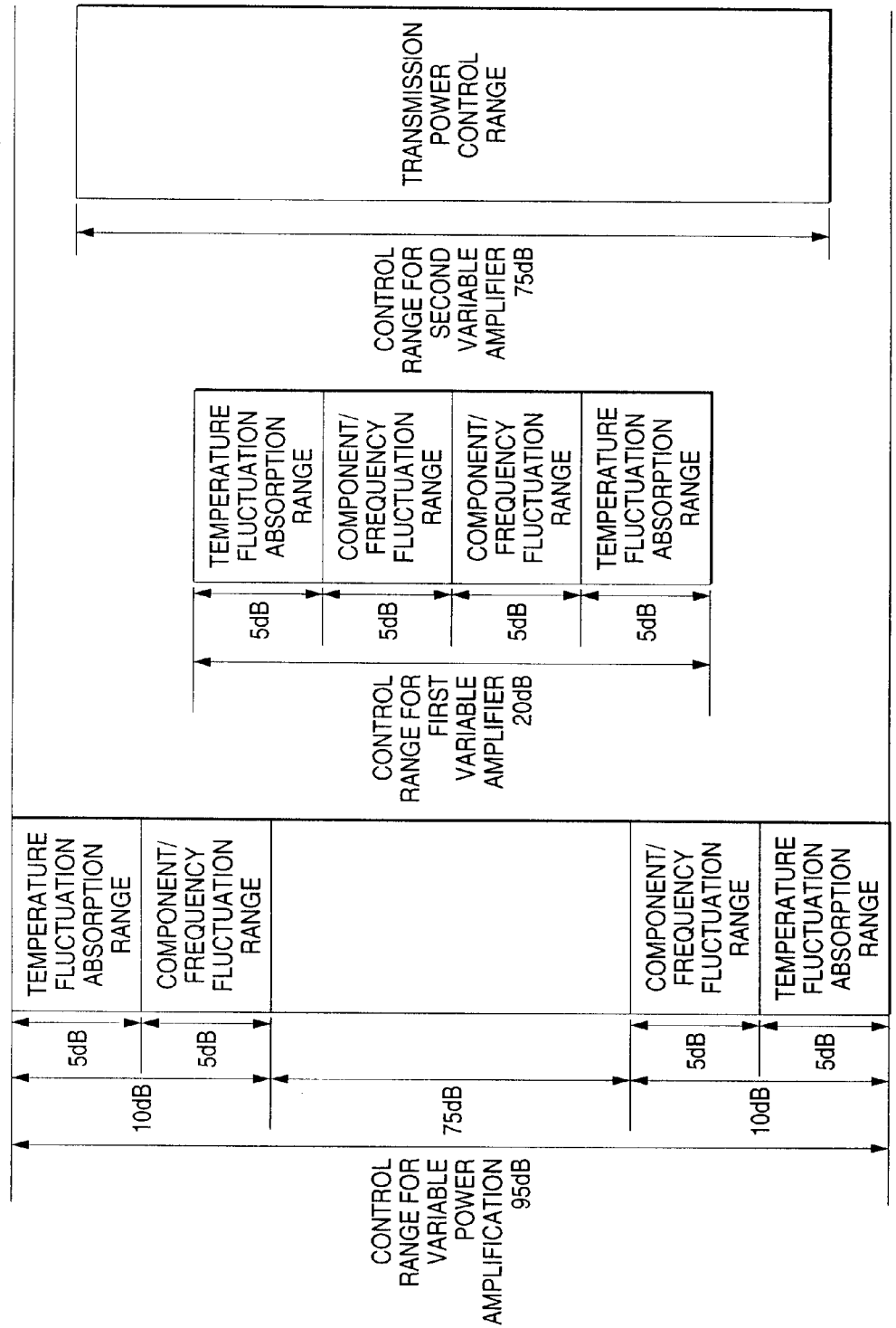

LEVEL DIAGRAM

LEVEL DIAGRAM

RADIO COMMUNICATION APPARATUS AND TRANSMISSION POWER CONTROL METHOD THEREIN

BACKGROUND OF THE INVENTION

The present invention is related to a radio communication apparatus such as a mobile communication appliance for performing a mobile communication in a portable telephone, and also related to a transmission power control method in this radio communication apparatus.

In general, mobile communication appliances such as portable telephone units are equipped with functions capable of controlling transmission power of own units based upon distances between base stations and mobile stations while information is transmitted. In the multiple access type communication system for multiplexing a plurality of communication channels, a transmission power control for maintaining power of a signal reached to a base station at a constant value is necessarily required in order to increase a frequency utilization efficiency while reducing interference occurred between communication channels.

More specifically, in a CDMA (Code Division Multiple Access) type mobile communication appliance with employing a spread spectrum communication technique, since a single frequency band is commonly used by a plurality of users, there are great possibilities that a signal having low transmission power is masked by a signal having high transmission power, namely a so-called "far/near problem". Thus, the following problem would occur. That is, a signal transmitted from another station may function as an interference signal wave to cause a line quality to be deteriorated. To solve such a problem, conventionally, various sorts of transmission power control techniques have been studied. In particular, the transmission power control system by the closed loop is known as the transmission power control system capable of tracing such interference signals which are instantaneously varied. More specifically, in the CDMA system, the transmission power control with a high linearity and a wide dynamic range (for instance, 70 to 80 dB) is required. Furthermore, in the wide-band CDMA (W-CDMA), higher precision of the transmission power is required when signals having high power are transmitted, and thus, higher precision of the transmission power control operation is further required. This wide-band CDMA system has been considered as the mobile communication system for the next generation.

FIG. 19 is a flow chart for showing an example of the conventional transmission power control method by the closed loop. This transmission power control method may be used in the transmission power control and other controls by open/close loop controls executed based upon the IS-95 rule of TIA (Telecommunications Industry Association).

In a communication is established between a base station and a mobile station, the mobile station determines a transmission power control bit based on reception power of a reception signal wave (desirable signal wave) sent from the base station (S101), inserts this transmission power control bit into a transmission signal, and then transmits the resultant transmission signal to the base station. The base station receives the signal transmitted from the mobile station, extracts the transmission power control bit from the reception signal (S105), and then controls a variable power amplifier of the own station in accordance with the instruction of this transmission power control bit (S106).

Similarly, the base station determines a transmission power control bit based on reception power of a reception signal wave sent from the mobile station (S104), inserts this transmission power control bit into a transmission signal, and then transmits the resultant transmission signal to the mobile station. The mobile station receives the signal transmitted from the base station, extracts the transmission power control bit from the reception signal (S102), and then controls a variable power amplifier of the own station in accordance with the instruction of this transmission power control bit (S103).

Since such a transmission power control is carried out, it is possible to keep the reception power substantially constant in both the base station and the mobile station irrespective of the distance between the base station and the mobile station.

For example, in "TRANSMISSION POWER CONTROL METHOD AND SPREAD SPECTRUM COMMUNICATION APPARATUS WITH USING CONTROL METHOD THEREOF" described in Japanese Laid-open Patent Application No. Hei-8-32513 opened in 1996, the transmission power is controlled based upon the transmission power control amount corresponding to a total number of the transmission power bit having the same bit value which is continuously received. As a consequence, the increased or decreased step of the transmission power are increased while the continuous reception time has elapsed in order to follow the rapid variation in the communication path.

In the above-explained conventional transmission power control method, since the transmission power control operation is carried out by a single transmission power control system (variable power amplifier), the high-precision variable power amplifier is required in order that, in particular, such a transmission power control operation having a high linearity and a wide dynamic range is carried out. This transmission power control operation is required for the CDMA system Also, the variable power amplifier amplification function must be carried out in high precision.

However, when a variable power amplifier is controlled in high precision with employment of such a high-precision variable power amplifier, the following problems will occur. That is, a circuit scale is increased, a power consumption amount is increased, and an entire apparatus would be made in high cost. Also, it is practically difficult to employ only one variable power amplifier for realizing a wide-range gain control, while maintaining high precision. Furthermore, in the case that a mobile station is a portable telephone, while the transmission power is controlled in high precision, the power consumption is required to be suppressed by reducing the circuit scale (namely, circuit is made simple and compact). As a result, considering the power consumption, the portability, and the apparatus cost, there are various difficulties in order to realize the high-precision transmission power control over the wide range by using the conventional transmission power control method.

SUMMARY OF THE INVENTION

The present invention has been made to solve the above-described problems, and therefore, has an object to provide a compact radio communication apparatus operable under low power consumption, and a transmission power control method in such a radio communication apparatus, while realizing a transmission power control means with having a simple arrangement and operable under low power consumption, and increasing precision of a transmission power control operation.

To achieve the above-described object, a radio communication apparatus, according to the present invention, comprises a transmission power control function capable of controlling transmission power to a communication counter station, comprising: a plurality of variable power amplifying means for amplifying transmission power; and variable power amplifying-controlling means for controlling the plurality of variable power amplifying means in either a serial control manner or a parallel control manner over an entire control range to thereby perform a variable amplifying-controlling operation.

Preferably, the variable power amplifying-controlling means compares own transmission power stored therein with a predetermined threshold value, and then, performs the serial control manner with respect to the plurality of variable power amplifying means over the entire control range based upon the comparison result.

Preferably, the variable power amplifying-controlling means includes: control bit extracting means for extracting a transmission power control bit transmitted from a communication counter station; transmission power storing means for updating the own transmission power stored thereinto based upon the transmission power control bit; comparing means for comparing the own transmission power stored thereinto with a predetermined threshold value; and controlling-outputting means for sending out a control signal to the plurality of variable power amplifying means based upon the comparison result so as to perform the serial control manner with respect to the plurality of variable power amplifying means over the entire control range.

Alternatively, the variable power amplifying-controlling means includes: control bit extracting means for extracting a transmission power control bit transmission power control bit transmitted from a communication counter station; transmission power storing means for updating the own transmission power stored thereinto based upon the transmission power control bit; and controlling-outputting means for sending out a control signal to the plurality of variable power amplifying means based upon the own transmission power stored thereinto so as to perform the serial control manner with respect to the plurality of variable power amplifying means over the entire control range.

Further, preferably, as the plurality of variable power amplifying means, two variable power amplifiers series-connected to each other are provided; and the variable power amplifying-controlling means performs the variable amplifying-controlling operation in either the serial control manner or the parallel control manner over the entire control range with respect to the two variable power amplifiers.

Also, a variable amplifier may be further employed at a prestage of the plurality of variable power amplifying means; the variable power amplifying-controlling means further performs the variable amplifying-controlling operation in either the serial manner or the parallel manner among the variable power amplifying means with respect to the variable amplifier.

A transmission power control method in a radio communication apparatus, according to the present invention, for controlling transmission power to a communication counter station, comprising: a variable power amplifying-controlling step for controlling a plurality of variable power amplifying means over an entire control range either in a serial manner or a parallel manner so as to perform a variable amplifying-controlling operation.

Preferably, in the variable power amplifying-controlling step, own transmission power stored thereinto is compared with a predetermined threshold value, and then, the serial control manner with respect to the plurality of variable power amplifying means is performed over the entire control range based upon the comparison result.

Also, the variable power amplifying-controlling step may contains: a control bit extracting step for extracting a transmission power control bit transmitted from a communication counter station; a transmission power storing step for updating the own transmission power stored thereinto based upon the transmission power control bit; a comparing step for comparing the own transmission power stored thereinto with a predetermined threshold value; and a controlling-outputting step for sending out a control signal to the plurality of variable power amplifying means based upon the comparison result so as to perform the serial control manner with respect to the plurality of variable power amplifying means over the entire control range.

Alternatively, the variable power amplifying-controlling step may contains: a control bit extracting step for extracting a transmission power control bit transmitted from a communication counter station; a transmission power storing step for updating the own transmission power stored thereinto based upon the transmission power control bit; and a controlling-outputting step for sending out a control signal to the plurality of variable power amplifying means based upon the comparison result so as to perform the serial control manner with respect to the plurality of variable power amplifying means over the entire control range.

Further, preferably, in the variable power amplifying-controlling step, the variable amplifying-controlling operation is carried out in either the serial control manner or the parallel manner among the variable power amplifying means with respect to a variable amplifier provided at a prestage of the plurality of variable power amplifying means.

In accordance with the radio communication apparatus of the present invention and also the transmission power control method of this radio communication apparatus, a plurality of variable power amplifying means are controlled either in the serial control manner or the parallel control manner over the entire control range so as to perform the variable amplifying-controlling operation. In this case, the fluctuations occurred in both edge portions of the variable range of each of the variable power amplifying means are preferably controlled to be absorbed by way of either the serial control manner or the parallel control manner for a plurality of variable power amplifying means. As a result, the linearity within the control range can be improved, and the high-precision transmission power control with a simple arrangement and over a wide range can be carried out, as compared in the general control case that one variable power amplifying means is controlled. Also, since these plural variable power amplifying means are controlled in either the serial manner or the parallel manner, the carrier-to-noise ratio (C/N) of the transmission signal in the radio communication apparatus can be improved, and also the communication can be made simple and compact. As a result, while the control precision of the transmission power is maintained, the circuit scale can be reduced. In particular, when the serial, or parallel control manner is employed in the mobile station, since the circuit can be made simple and compact, the portability can be improved, and the power consumption can be suppressed.

Also, the variable amplifying-controlling operation is further carried out either in the serial control manner or in the parallel control manner among a plurality of variable power amplifying means with respect to the variable amplifier provided at the prestage of the plural variable power amplifying means. Also, in this case, the linearity within the above-described control range can be improved, and since either the serial control manner or the parallel control manner is additionally provided with respect to the variable amplifier, the C/N can be further improved.

BRIEF DESCRIPTION OF THE DRAWINGS

FIG. 2 is a flow chart for describing a sequential operation of a transmission power control method according to an embodiment of the present invention;

FIG. 4 is a diagram for explaining the general control example with respect to the predetermined control range shown in FIG. 3;

DETAILED DESCRIPTION OF THE PREFERRED EMBODIMENTS

Referring now to drawings, embodiment modes of the present invention will be described in detail.

Figure 1:
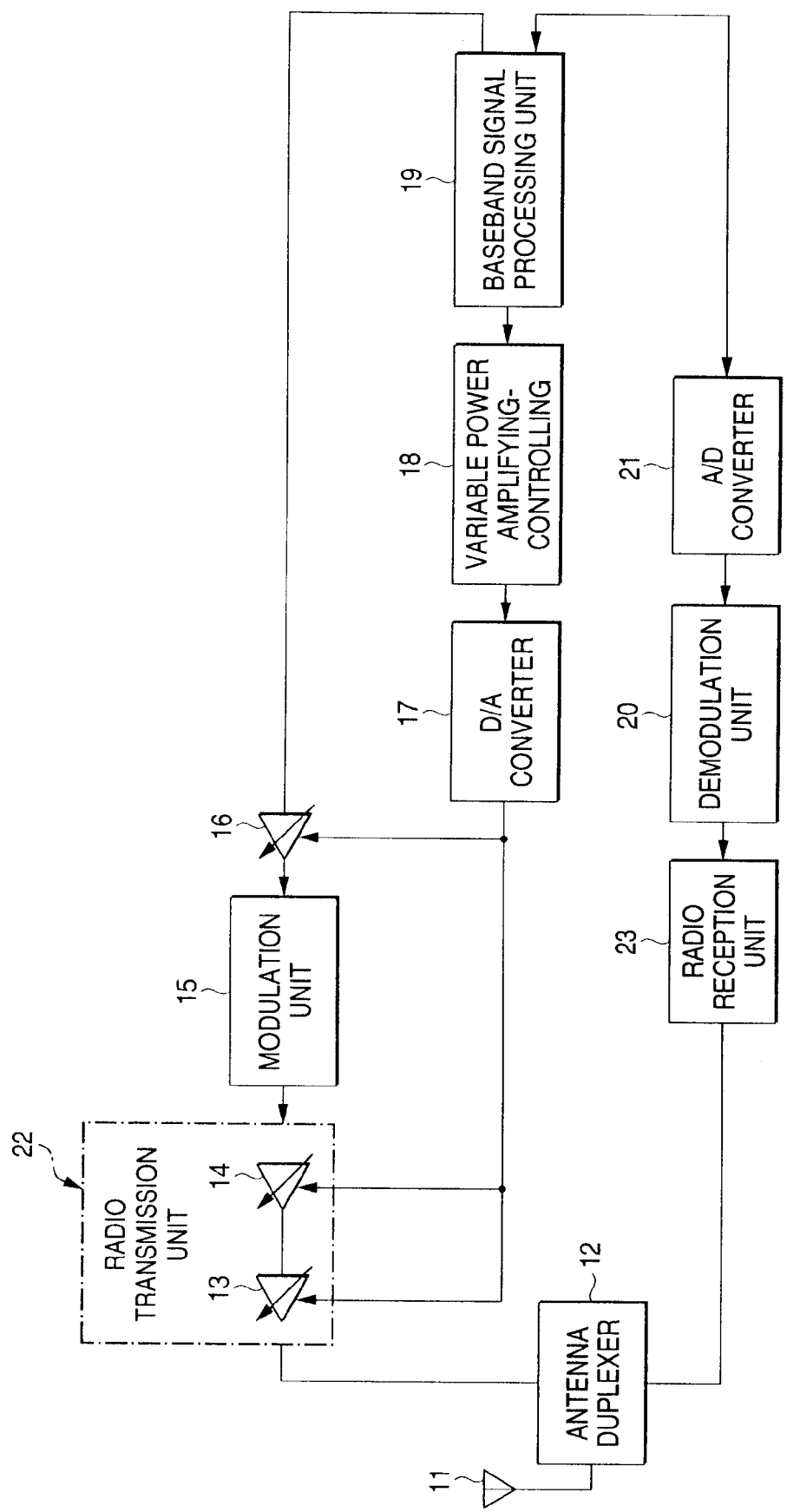
FIG. 1 is a block diagram for indicating an arrangement of a major unit of a radio communication apparatus according to an embodiment of the present invention.

FIG. 1 is a block diagram for showing an arrangement of a major portion of a radio communication apparatus according to an embodiment mode of the present invention. FIG. 2 is a flow chart for describing a sequential operation of a transmission power control method according to an embodiment mode of the present invention.

The radio communication apparatus according to this embodiment is provided in, for example, a base station of a cellular communication system, or a mobile communication appliance for constituting a mobile station. The radio communication apparatus power-amplifies a signal containing transfer information so as to transmit the power-amplified signal to a communication counter party. It should be understood that the transmission power control method described in this embodiment is suitably utilized in such a case that a high-precision transmission power control operation must be carried out while maintaining high linearity over a wide power control range, in particular, in a mobile communication appliance of the CDMA system. However, this embodiment mode is not limited to such a mobile communication appliance, but may be properly applied to other radio communication apparatuses which require the similar transmission power controls.

The radio communication apparatus contains an antenna 11 for transmitting/receiving a radio signal, and an antenna shared (commonly-used) device (duplexer) 12 which separates a transmission signal and a reception signal from each other, and commonly uses the antenna 11 as a radio transmission/reception device. A signal reception system of this radio communication apparatus is arranged by a radio reception unit 23, a demodulation unit 20, an A/D converter (ADC) 21, and a baseband signal process unit 19. The radio reception unit 23 converts the frequency of the reception signal into an intermediate frequency band (IF band). The demodulation unit 20 converts the reception signal into a baseband signal. The A/D converter 21 converts an analog signal into a digital signal. The baseband signal process unit 19 performs a signal processing operation and a decoding operation of the received baseband signal.

Also, a signal transmission system of:the radio communication apparatus contains a first variable power amplifier 13 and a second variable power amplifier 14, and also a radio transmission unit 22. In the first variable power amplifier 13 and the second variable power amplifier 14, a variable power amplifying-controlling operation is carried out in serial control manner or a parallel control manner (will be discussed later in detail). The radio transmission unit 22 performs a frequency conversion to a radio frequency band (RF band), and a power amplification. Also, a prestage of the radio transmission unit 22 contains a modulation unit 15 for frequency-converting the transmission signal into the IF band. At a prestage of this modulation unit 15, there are provided a variable amplifier 16 for variably amplifying the unmodulated transmission signal, and the above-explained baseband signal process unit 19 for performing the signal processing operation and the decoding operation of the baseband signal to be transmitted.

Then, as a transmission power control system, this radio communication apparatus is equipped with the baseband signal process unit 19; the first variable amplifier 13 and second variable amplifier 14 which correspond to a plurality of variable power amplifying-controlling means; and the variable amplifier 16. The above-described baseband signal process unit 19 determines a transmission power control bit based upon a reception signal sent from a communication counter station (either base station or mobile station, not shown), and then inserts this transmission power control bit into a transmission signal. This transmission power control system is further equipped with a variable power amplifying-controlling unit 18, and a digital-to-analog converter (DAC) 17 for converting a digital signal outputted from the variable power amplifying-controlling unit 18 into an analog signal. This variable power amplifying-controlling unit 18 corresponds to a variable power amplifying-controlling means, and controls gains of the first variable power amplifier 13, the second variable power amplifier 14, and the variable amplifier 16. The above-explained variable power amplifying-controlling unit 18 owns an: extract means, a transmission power storage means, a comparison means, and a control output means, as recited in a scope of claim for a patent.

In the case that the radio communication apparatus shown in FIG. 1 is applied to a mobile station, the baseband signal process unit 19 determines a transmission power control bit based upon a reception signal which is transmitted from a base station, and then inserts this determined transmission power control bit into a transmission signal. The transmission signal is amplified by the variable amplifier 16, and thereafter, the frequency of the amplified transmission signal is converted into the IF frequency band by the modulation unit 15. Furthermore, the IF frequency band of this transmission signal is converted into the RF frequency band by the radio transmission unit 22. After the frequency-converted transmission signal is power-amplified by both the first variable power amplifier 13 and the second variable power amplifier 14, the power-amplified transmission signal is transmitted via the antenna shared device 12 from the antenna 11 to the base station.

On the other hand, a signal transmitted from the base station is received by the antenna 11, and then, this reception signal is entered via the antenna shared device 12 to the radio reception unit 23. Then, the frequency of this reception signal is converted into the IF frequency band by the radio reception unit 23, and this frequency-converted reception signal is converted into a baseband signal by the demodulation unit 20. Thereafter, this baseband signal is converted into a digital signal by the A/D converter 21, and then, this digital signal is entered into the baseband signal processing unit 19.

The baseband signal process unit 19 extracts the transmission power control bit from the digital signal derived from the A/D converter 21. Then, the variable power amplifying-controlling unit 18 updates a value of transmission power stored into the own station based upon the value of this transmission power control bit, and compares this updated transmission power value with a predetermined value. In accordance with this comparison result, the variable power amplifying-controlling unit 18 sends a control signal to the first variable power amplifier 13, the second variable power amplifier 14, and the variable amplifier 16 so as to control the amplification gains thereof. As a result, the transmission power outputted from the antenna 11 is controlled to a preselected value.

Next, the sequential operation of the transmission power control method according to this embodiment mode will now be explained in detail with reference to FIG. 2. In FIG. 1 and FIG. 2, in the case that a communication is established between a base station and a mobile station, the mobile station receives a transmission electromagnetic wave of the base station, and determines a transmission power control bit based on reception power of this reception electromagnetic wave (step S21). Then, the mobile station inserts this transmission power control bit into a transmission signal, and then, transmits this resulting transmission signal to the base station. On the other hand, the base station receives the transmission electromagnetic wave sent from the mobile station, and then, extracts the transmission power control bit from this reception signal (step S32). The mobile station updates a value of transmission power stored in the own station based upon the value of this extracted transmission power control bit (step S33). Next, the base station compares this updated transmission power value with a preselected threshold value (step S34). Based upon this comparison result, the base station controls the first and second variable power amplifiers 13 and 14, and the variable amplifier 16 (step S35).

At this step S35, the base station controls the first and second variable power amplifiers 13 and 14, and the variable amplifier 16 based upon the value of the transmission power. In this case, generally speaking, the linearity of the variable power amplifier is deteriorated at both edge portions of the variable range. Considering this deterioration of linearity, both edge portions of the variable ranges of the first and second variable power amplifiers 13 and 14 are employed so as to adjust the characteristics, for example, to absorb fluctuations, so that the power control characteristic for the entire variable power amplifying means does not represent a non-linear characteristic. Concretely speaking, while the overall control range is subdivided into a plurality of control ranges by using a predetermined threshold value, any one of the first and second variable power amplifiers 13 and 14, or both of these first and second variable power amplifiers are operated in each of these subdivided control ranges, and the variable power amplifiers are controlled in either the serial manner or the parallel manner, so that the transmission power is adjusted. In addition, the variable amplifier 16 is controlled so as to increase the value of the unmodulated baseband signal. As a result, since the linearity within the control rang is improved, as compared with the contentional case such that the control method for controlling one variable power amplifier is employed, the precision of transmission power control can be improved.

Figures 3A, 3B, 3C:
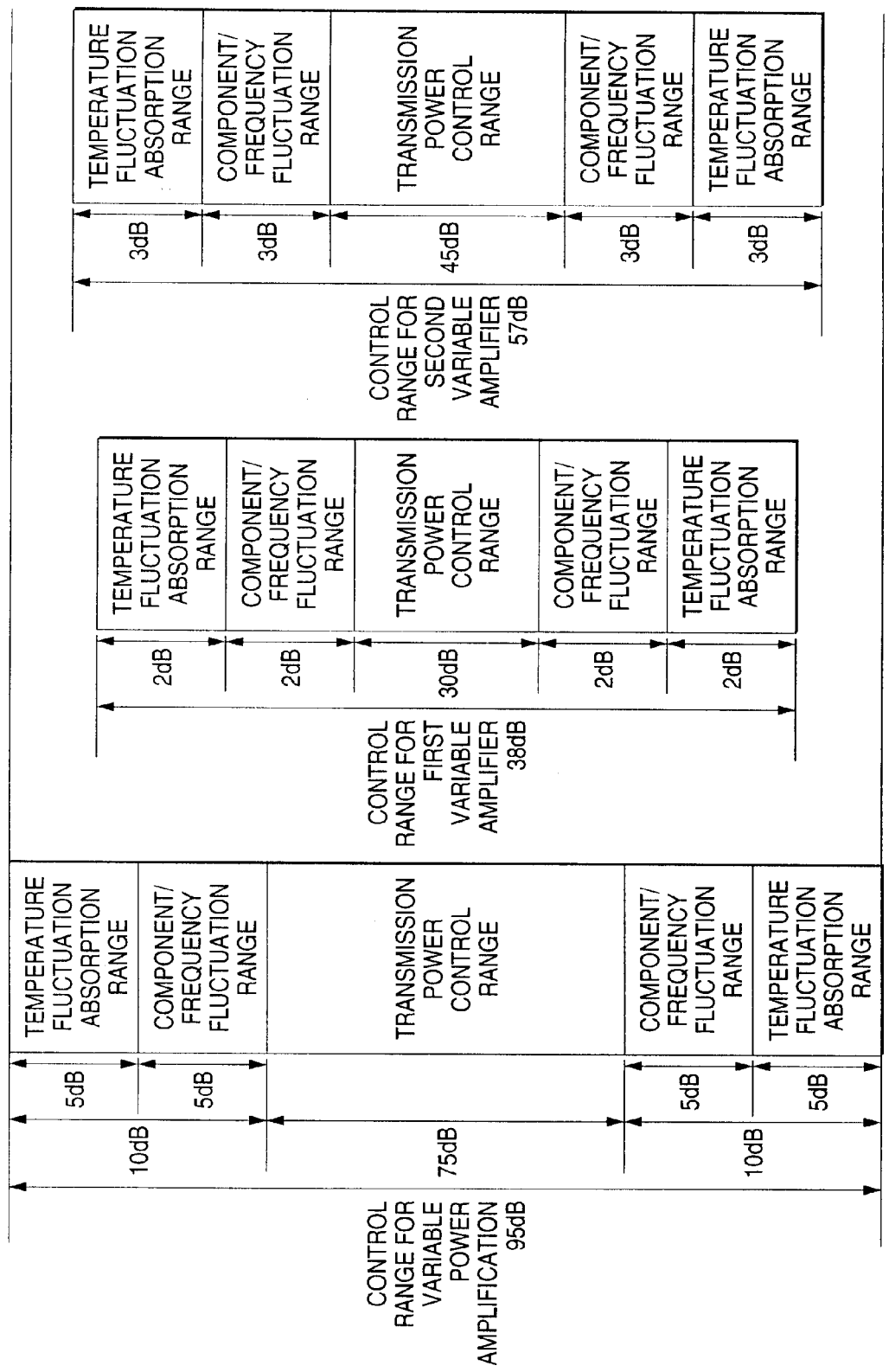
FIG. 3 is a diagram for explaining predetermined control ranges of first and second variable amplifiers in this embodiment.

FIG. 3 is a diagram for explaining the predetermined control ranges of the first and second variable power amplifiers 13 and 14 according to this embodiment mode. FIG. 4 is a diagram for explaining a general control example with respect to FIG. 3.

In this case, as shown in part (3) of FIG. 3, there is shown such an example that a predetermined control range of the overall variable power amplification=95 [dB]. This range is set to a predetermined transmission power control range=75 [dB]; a temperature fluctuation absorption range=+5 and −5 [dB]; components/frequency fluctuation absorption range±+5 [dB]; and furthermore, a control ratio of the first variable power amplifier 13 to the second variable power amplifier 14=2:3.

As represented in parts (b) and (c) of FIG. 3, the respective range [dB] are subdivided, and the variable power control operation is executed by each of the variable power amplifiers. That is to say, the transmission power control operation is carried out by the first variable power amplifier 13 under such a condition that the power control range=38 [dB] (temperature fluctuation absorption range=±2 [dB]; transmission power control range=30 [dB]; and component and frequency fluctuation absorption range=±2 [dB]). Also, the transmission power control is carried out by the second variable power amplifier 14 under such a condition that the power control range=57 [dB] (temperature fluctuation absorption range=±3 [dB]; transmission power control range=45 [dB]; and component/frequency fluctuation absorption range=±3 [dB]).

In contrast, in the general control example shown in FIG. 4, with respect to the predetermined control range of the entire variable power amplification indicated in part (a) of FIG. 4 being equal to 95 dB, the power control operation by the first variable power amplifier is carried out as shown in part (b) of FIG. 4 under such a condition that the temperature fluctuation absorption range=±5 [dB], and the frequency fluctuation absorption range=±5 [dB]. Also, as indicated in part (c) of FIG. 4, the transmission power control by the second variable power amplifier is carried out under such a condition that the transmission power control range=75 [dB].

In accordance with the transmission power control method shown in FIG. 3, the predetermined control range of the variable power amplification by a plurality of variable power amplifier is subdivided, the both edge portions of each of these subdivided variable ranges are employed so as to adjust; for example, fluctuation absorption, and the transmission power control is carried out within the higher linearity range. As a consequence, the higher linearity characteristic can be maintained within the control range, as compared with the general control example shown in FIG. 4. Also, even when the arrangement of the variable power amplifier is made simple, since the precision of the transmission power control operation can be maintained, the radio communication can be made simple and in low cost, and further, the power consumption thereof can be suppressed.

As a concrete example of the transmission power control operation according to this embodiment mode, there are the below-mentioned items (1), (2), and (3). These items will now be explained in turn:

(i) The first variable power amplifier 13 and the second variable power amplifier 14 are controlled in a serial variable power amplifying-controlling manner. In other words, the variable power amplifying-controlling operation is sequentially carried out with respect to the first and second variable power amplifiers 13 and 14.

(ii) The first variable power amplifier 13 and the second variable power amplifier 14 are controlled in a parallel variable power amplifying-controlling manner. In other words, the variable power amplifying-controlling operation is simultaneously carried out with respect to the first and second variable power amplifiers 13 and 14.

(iii) While the variable amplification by the variable amplifier 16 is additionally carried out with respect to the first variable power amplifier 13 and the second variable power amplifier 14, the first and second power amplifiers 13 and 14 are controlled in the serial, or parallel variable power amplifying-controlling manner.

(1) [Serial variable power amplifying-controlling operation of first/second variable power amplifiers 13/14]

In the case that the first and second variable power amplifiers 13 and 14 are active elements, as to the output noise of this active element, the smaller the input noise becomes, the easier this output noise may be adversely influenced by the noise figure (NF). As a consequence, when the first and second variable power amplifiers 13 and 14 are controlled in the serial control manner, the values of the transmission power entered into the respective elements (first and second variable power amplifiers 13 and 14) are increased, and the carrier-to-noise ratio (C/N) thereof is improved, as compared with the conventional method for controlling a single variable power amplifier.

Figure 5:
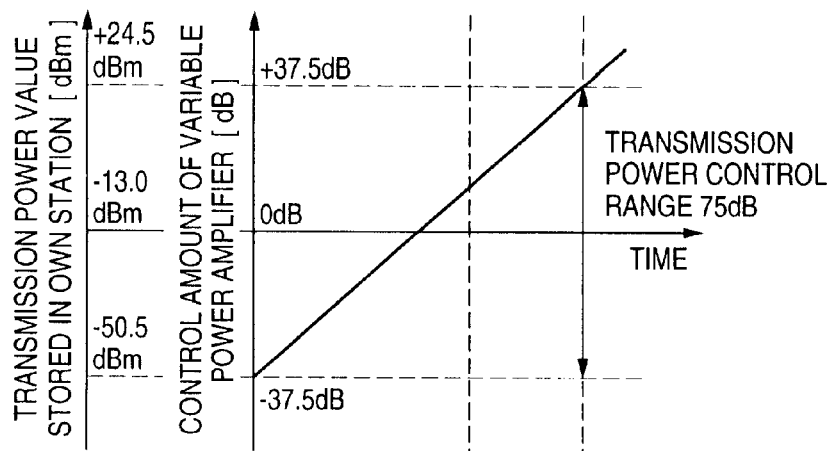
FIG. 5 shows a characteristic diagram for describing a control content when the first and second variable power amplifiers are controlled in a serial control manner.
Figure 5:
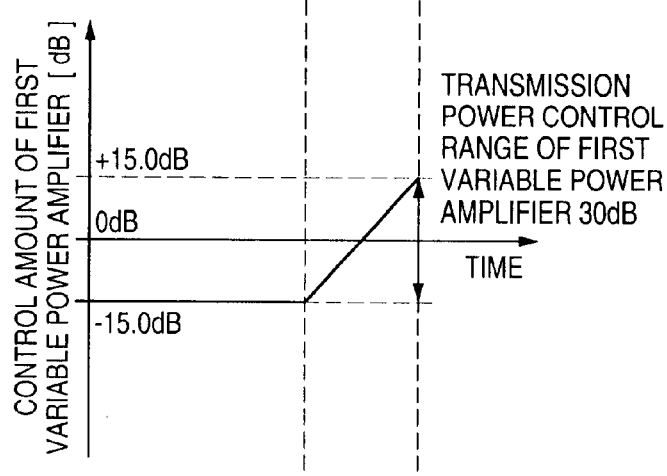
Figure 5:
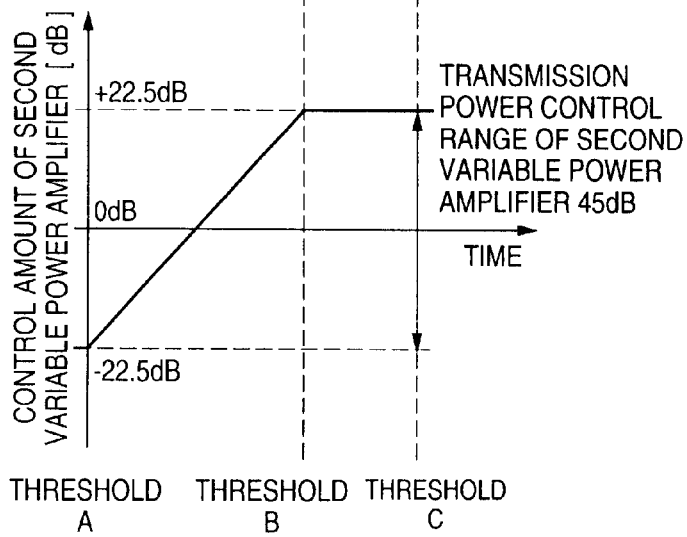
Figure 6:
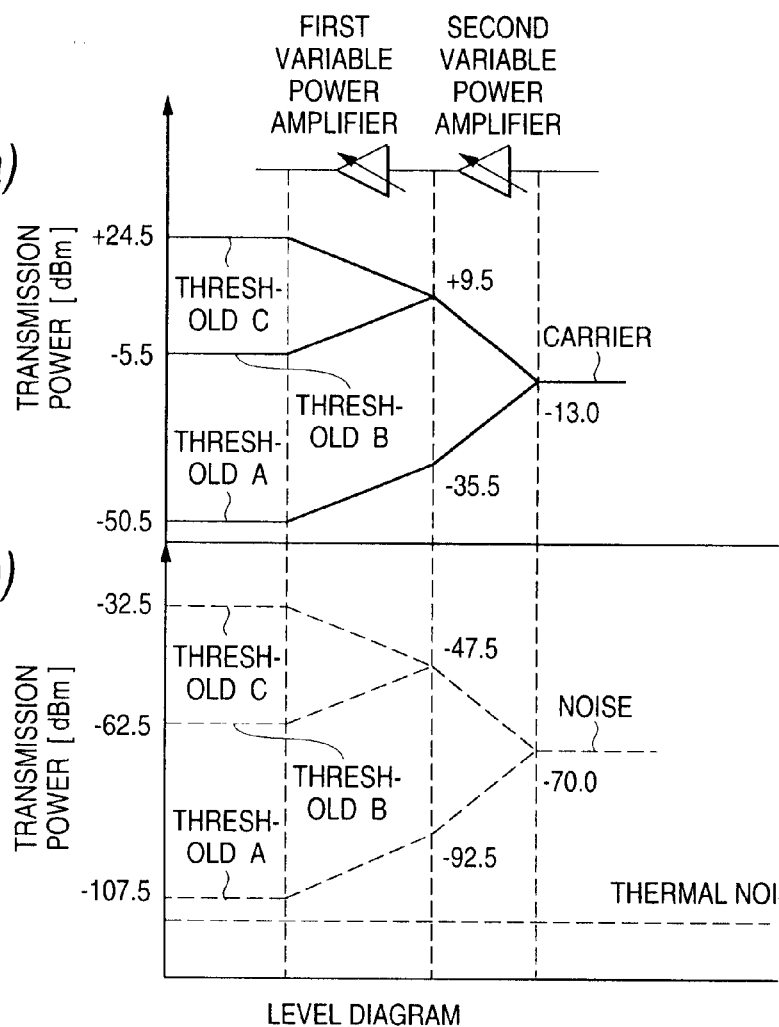
FIG. 6 is a characteristic diagram for representing both the carrier and the noise in the control content of FIG. 5.
Figure 7:
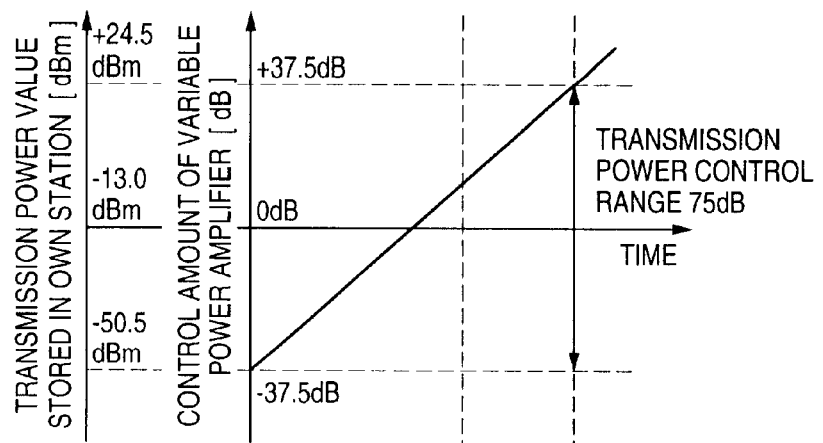
FIG. 7 is a characteristic diagram for explaining a general control example with respect to the control content of FIG. 5.
Figure 7:
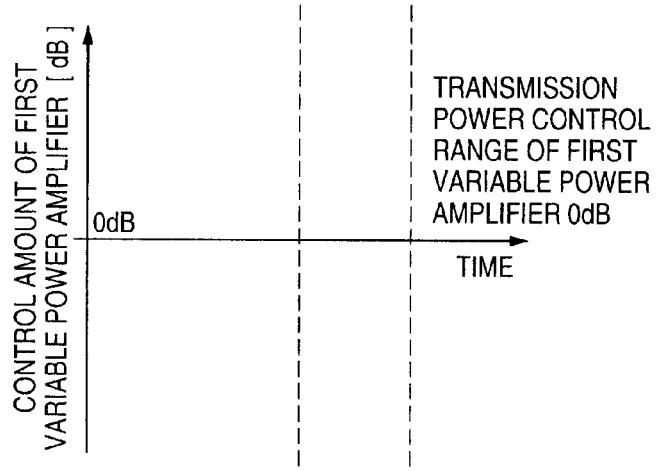
Figure 7:
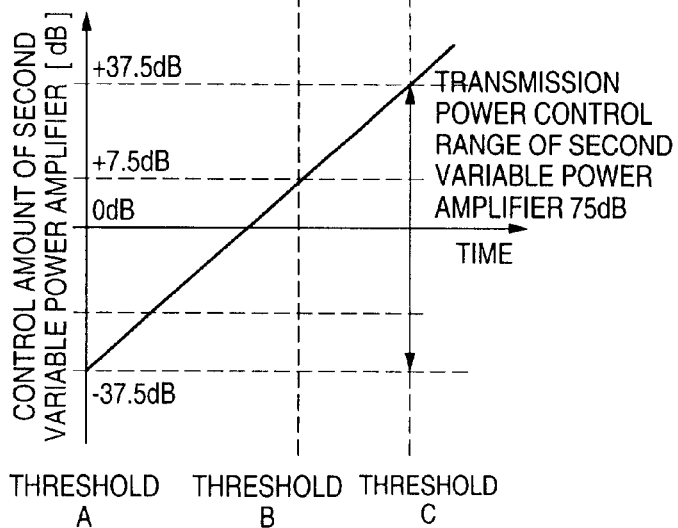
Figure 8A:
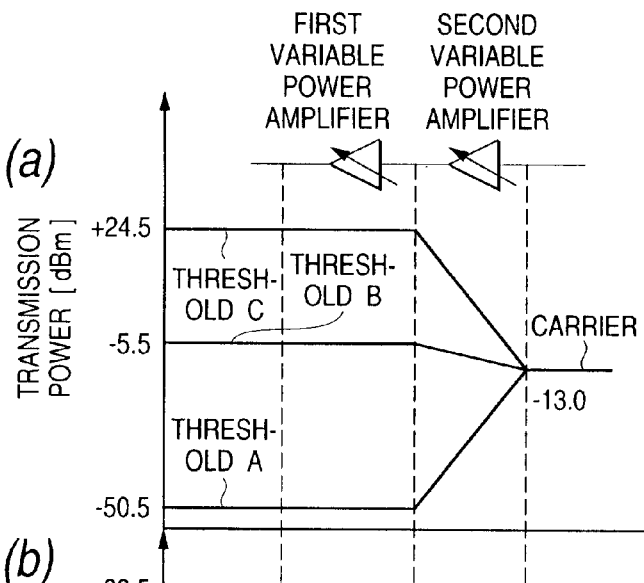
FIG. 8 is a characteristic diagram for indicating carrier and noise characteristics in the general control content of FIG. 7.
Figure 8B:
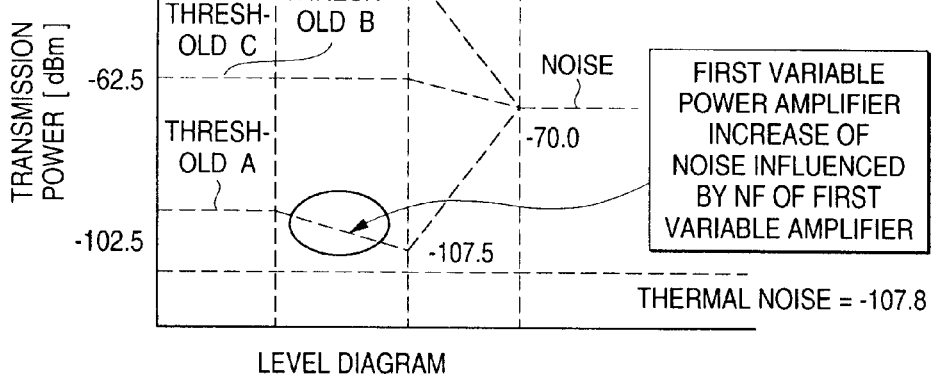

FIG. 5 and FIG. 6 are diagrams for explaining the contents obtained when both the first variable power amplifier 13 and the second variable power amplifier 14 are controlled in the serial control manner. FIG. 7 and FIG. 8 are diagrams for explaining the general control example with respect to the control operations of FIG. 7 and FIG. 8.

In this case, the following conditions are exemplified: A predetermined transmission power control range=75 [dB], and furthermore, a control ratio of the first variable power amplifier 13 to the second variable power amplifier 14 is equal to 2:3 in contrast to the above-described preselected control range of the overall variable power amplification of FIG. 3=95 [dB] (predetermined transmission power control range=75 [dB], temperature fluctuation absorption range=±5 [dB], and component/frequency fluctuation absorption range=±5 [dB]). Part (a) of FIG. 5 is a diagram for explaining a control content of an overall variable power amplifying-controlling operation corresponding to part (a) of FIG. 3; part (b) of FIG. 5 is a diagram for explaining a control content of the first variable power amplifier 13 corresponding to part (c) of FIG. 3; and part (c) of FIG. 5 is a diagram for explaining a control content of the second variable power amplifier 14 corresponding to part (c) of FIG. 3. Also, parts (a) and (b) of FIG. 6 represent carrier/noise characteristics (level diagram-to-transmission power [dBm]) in the control content of FIG. 5. Part (a) corresponds to the carrier, and part (b) corresponds to the noise.

Also, FIG. 7 and FIG. 8 are diagrams for explaining control contents of general control examples, which correspond to those of FIG. 5 and FIG. 6, respectively. In the control content shown in FIG. 7, as indicated in FIG. 8, in the first variable power amplifier, the input noise is decreased, and the noise is increased due to the adverse influence of the noise figure. As a result, the C/N would be deteriorated. To the contrary, in the control content of FIG. 5, as indicated in FIG. 6, the C/N can be kept under better condition over the entire control range without being adversely influenced by the noise figure.

(2) [Parallel variable power amplifying-controlling operation of first/second variable power amplifiers 13/14]

While the first variable power amplifier 13 and the second variable power amplifier 14 are controlled in the parallel control manner, when one of the first/second variable power amplifiers is selected as a high-precision variable power amplifier, the other amplifier may be selected as a low-precision variable power amplifier. In other words, the transmission power control operation is carried out in a coarse manner by using the other low-precision variable power amplifier, and also, the transmission power control operation is carried out in a fine manner by employing one high-precision variable power amplifier. As a result, since the allowable precision of the variable power amplifiers is lowered and the structures thereof can be made simple, the radio communication apparatus can be simplified, and furthermore can be made compact and in low cost.

Figure 9:
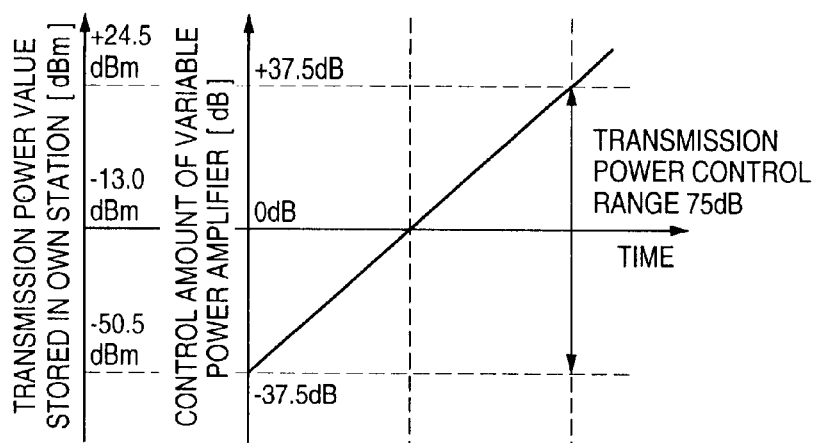
FIG. 9 shows a characteristic diagram for describing a control content when the first and second variable power amplifiers are controlled in a parallel control manner.
Figure 9:
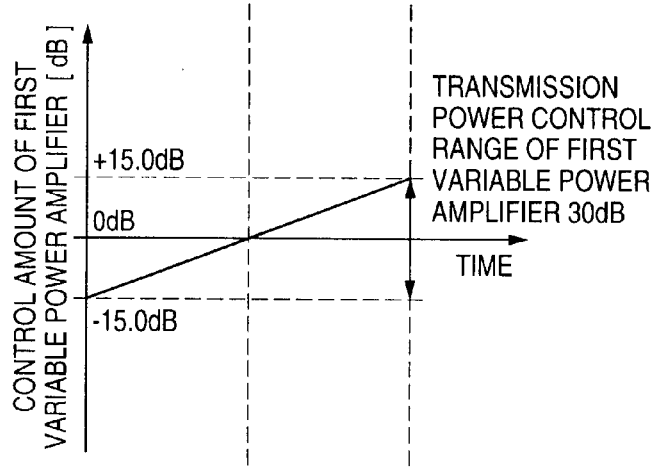
Figure 9:
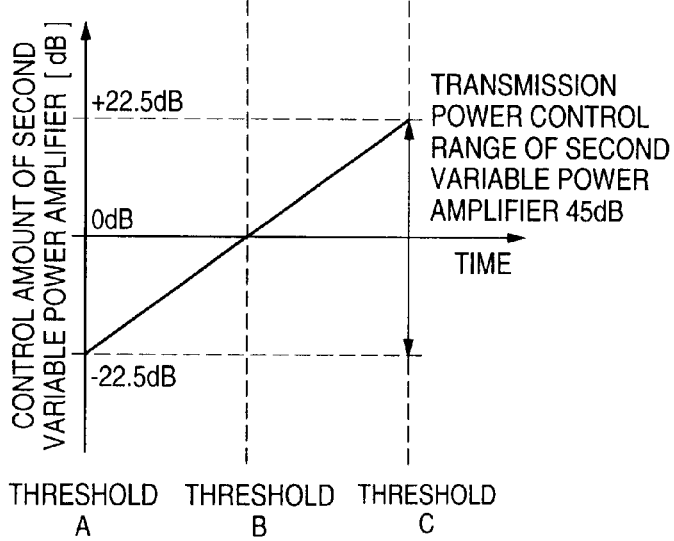
Figure 10:
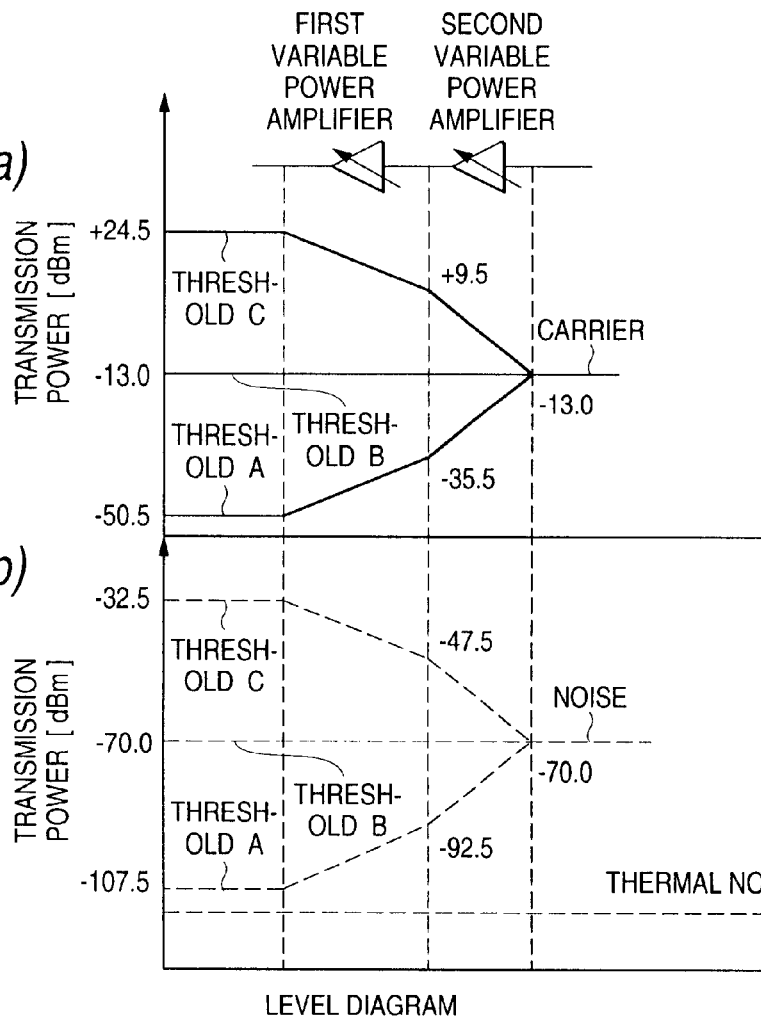
FIG. 10 is a characteristic diagram for representing both the carrier and the noise in the control content of FIG. 9.
Figure 11:
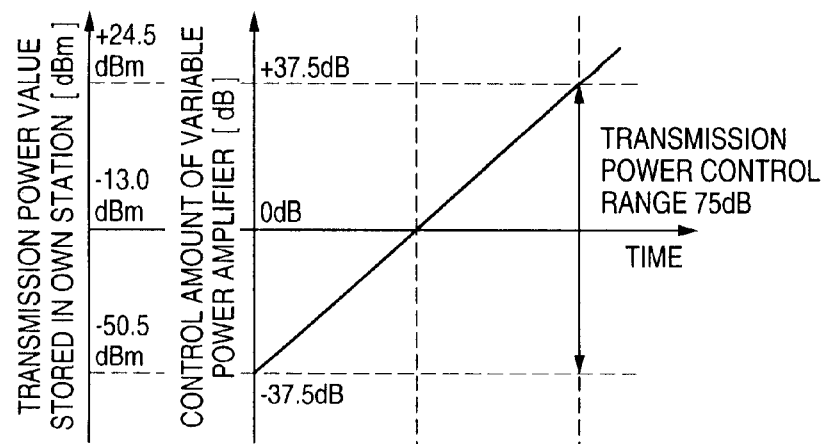
FIG. 11 is a characteristic diagram for explaining a general control example with respect to the control content of FIG. 9.
Figure 11:
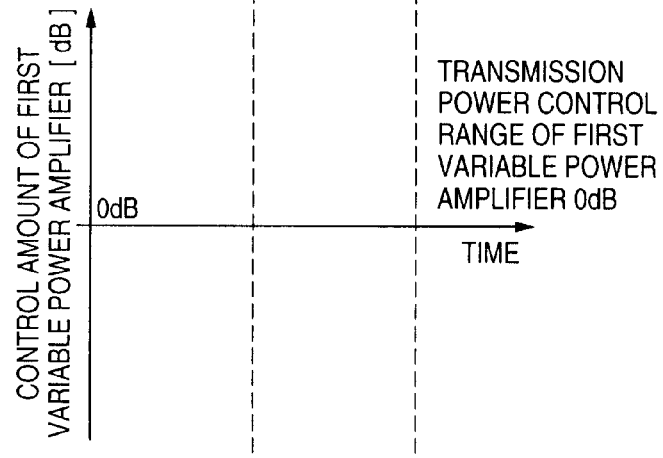
Figure 11:
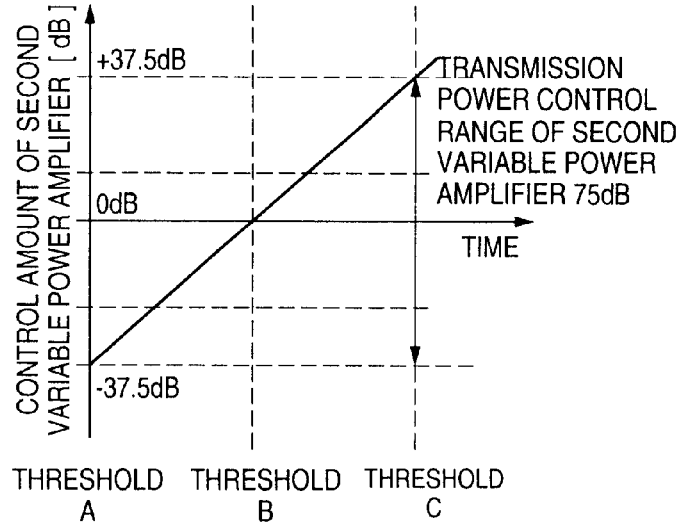
Figure 12:
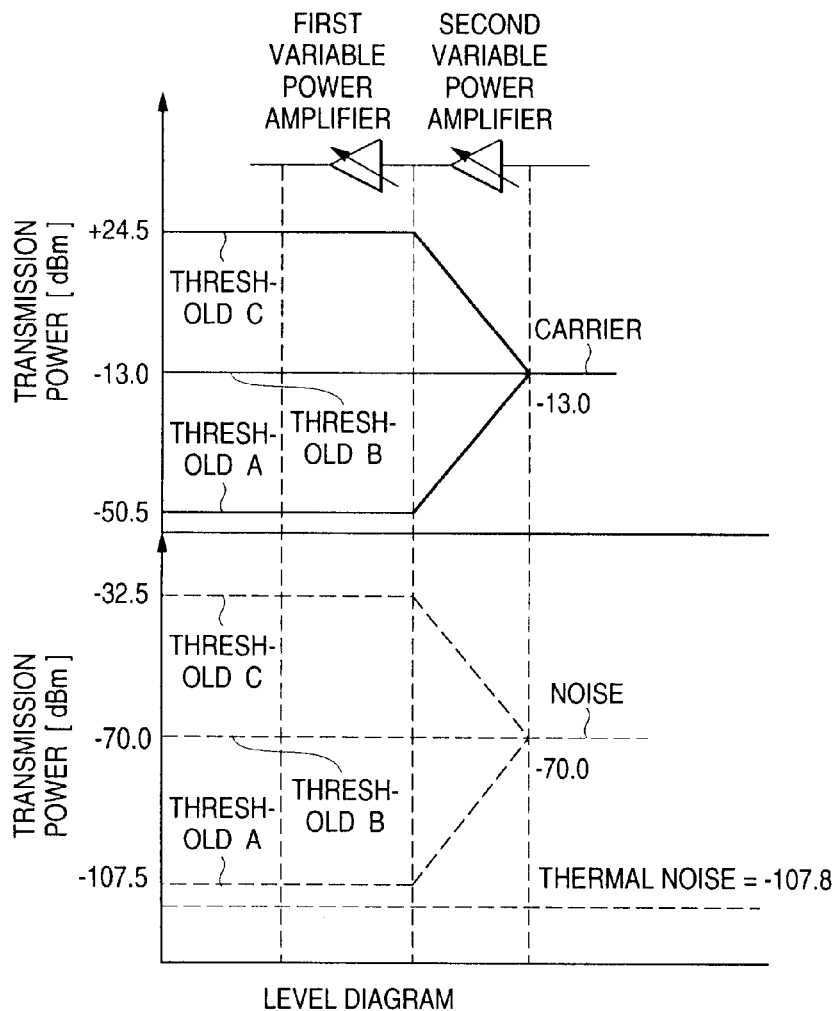
FIG. 12 is a characteristic diagram for indicating carrier and noise characteristics in the general control content of FIG. 11.

FIG. 9 and FIG. 10 are diagrams for explaining the contents obtained when both the first variable power amplifier 13 and the second variable power amplifier 14 are controlled in the parallel control manner. FIG. 11 and FIG. 12 are diagrams for explaining the general control example with respect to the control operations of FIG. 9 and FIG. 10.

In this case, the following conditions are exemplified: A predetermined transmission power control range=75 [dB], and furthermore, a control ratio of the firs variable power amplifier 13 to the second variable power amplifier 14 is equal to 2:3 in contrast to the above-described preselected control range of the overall variable power amplification of FIG. 3=95 [dB] (predetermined transmission power control range=75 [dB], temperature fluctuation absorption range=±5 [dB], and component and frequency fluctuation absorption range=±5 [dB]). Part (a) of FIG. 9 is a diagram for explaining a control content of an overall variable power amplifying-controlling operation corresponding to part (a) of FIG. 3; Part (b) of FIG. 9 is a diagram for explaining a control content of the first variable power amplifier 13 corresponding to part (b) of FIG. 3; and part (c) of FIG. 9 is a diagram for explaining a control content of the second variable power amplifier 14 corresponding to part (c) of FIG. 3. Also, parts (a) and (b) of FIG. 10 represent carrier/noise characteristics in the control content of FIG. 9. Part (a) corresponds to the carrier, and part(b) corresponds to the noise.

Also, FIG. 11 and FIG. 12 are diagrams for explaining control contents of general control examples, which correspond to those of FIG. 9 and FIG. 10, respectively. In the control content shown in FIG. 11, the high-precision transmission power control operation is required over the entire control range in the second variable power amplifier. In the control content of FIG. 9, while the first and second variable power amplifiers are controlled in the parallel manner, the coarse control operation and the fine control operation of the transmission power are shared to be executed. As a consequence, the allowable precision of the variable power amplifier can be lowered, and while the radio communication apparatus can be made simple and compact, the high-precision transmission power control operation can be carried out.

Figure 13:
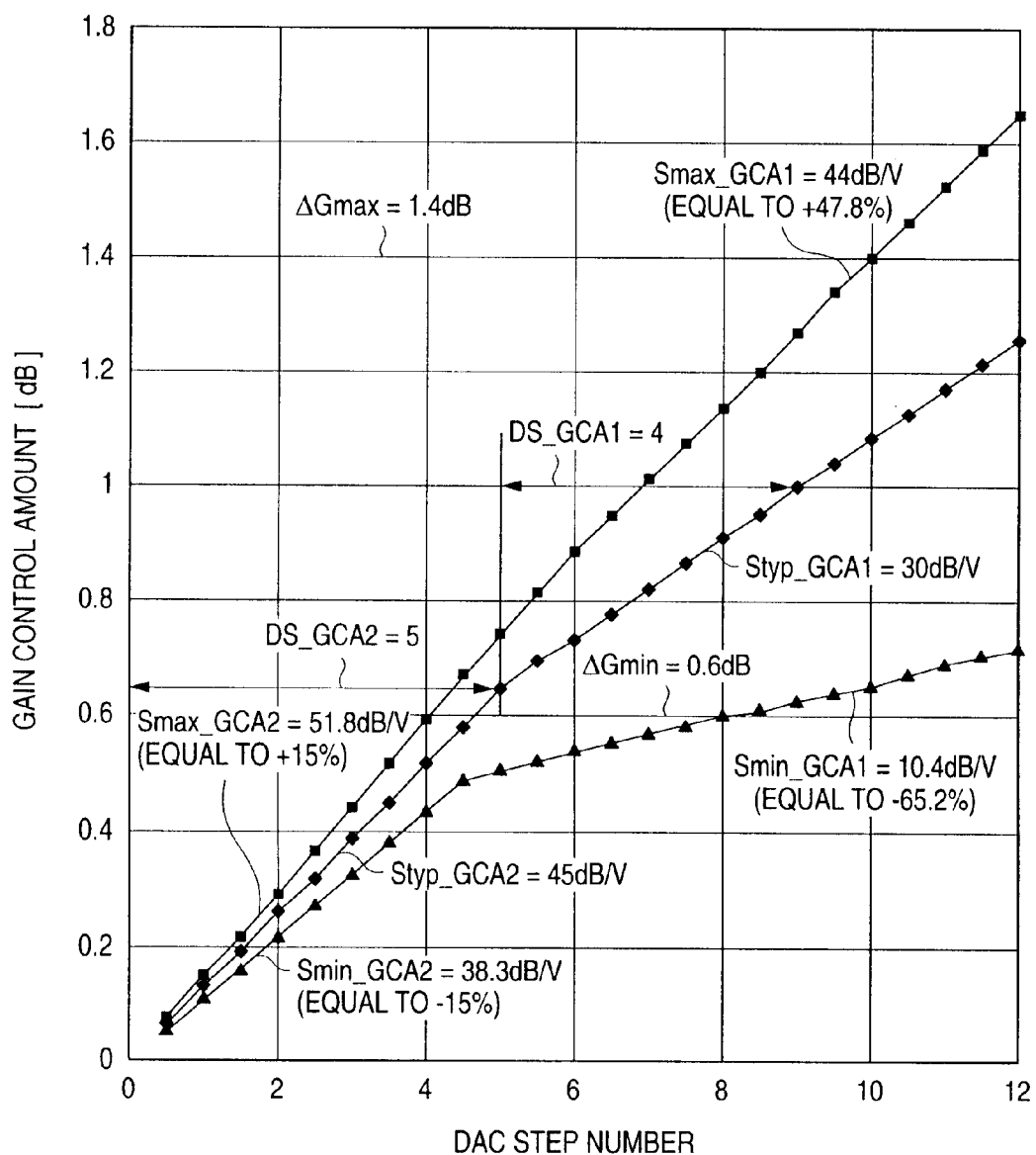
FIG. 13 is a characteristic diagram for describing a detailed control content per 1 control step in the control contents shown in FIG. 9 and FIG. 10.
Figure 14:
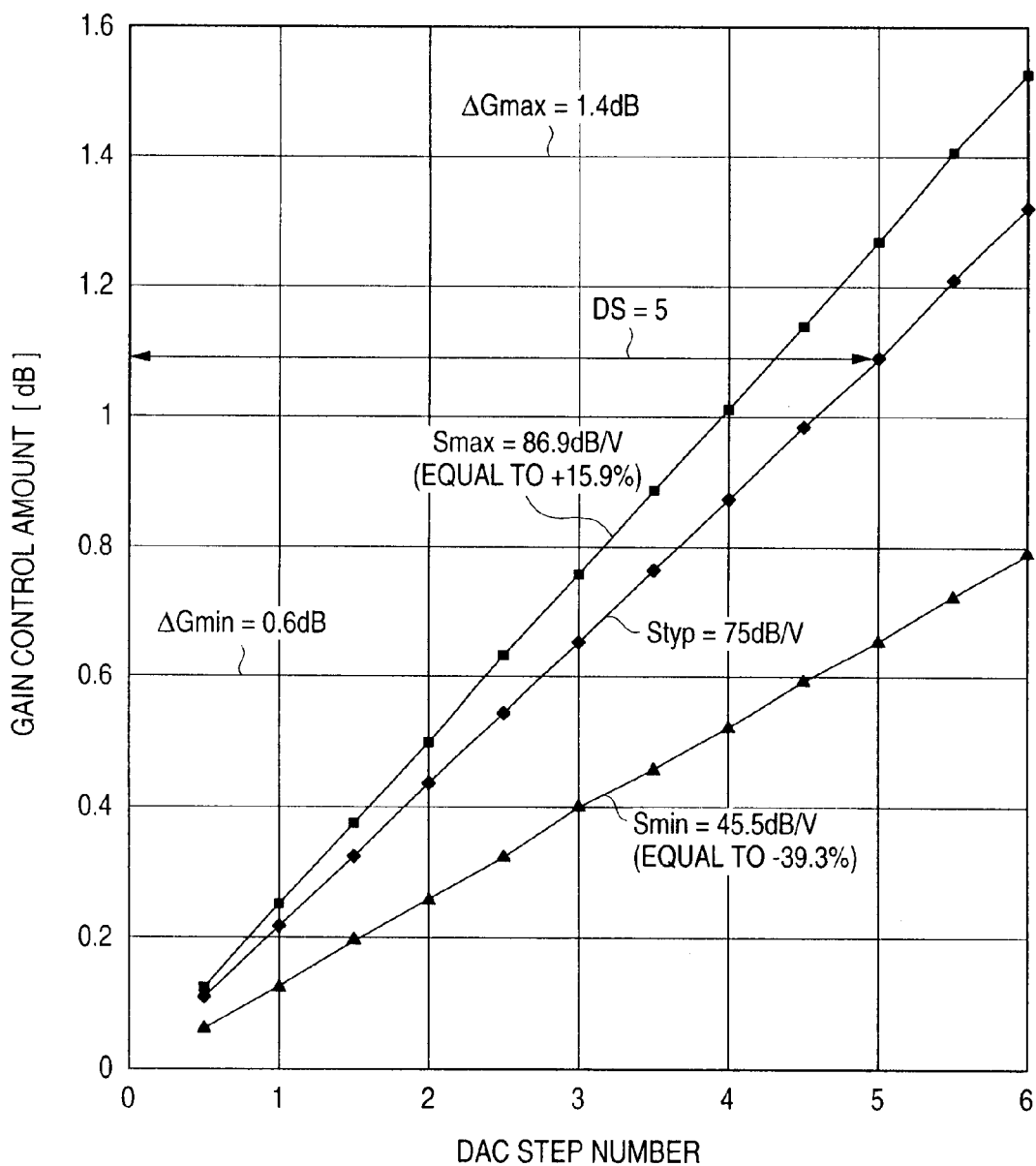
FIG. 14 is a characteristic diagram for describing a detailed control content per 1 control step in the general control contents shown in FIG. 11 and FIG. 12.

Now, detailed control contents per 1 control stop in the control contents shown in FIG. 9 to FIG. 12 are indicated in FIG. 13 and FIG. 14. FIG. 13 is a diagram for explaining a control content per 1 control step, corresponding to that of FIG. 9 and FIG. 10. FIG. 14 is a diagram for explaining a control content pr 1 control step in a general control example, corresponding to that of FIG. 11 and FIG. 12.

In FIG. 13 and FIG. 14, the following cases are represented: Predetermined increased/decreased power "ΔGtyp"=1 [dB]; An allowable minimum value of the increased/decreased power "ΔGmin"=0.6 [dB]; An allowable maximum value of the increased/decreased power "ΔGmax"=1.4 [dB]; A control voltage width DACV of the D/A converter (DAC) 17=1.5 [V]; A bit number DACN of the D/A converter 17=512; A control voltage DAC 1V per 1 step of the D/A converter 17=DACV/DACN=1.5/512 [V]. Also, FIG. 13 and FIG. 14 indicates the following cases: Predetermined control sensitivities of the first and second variable power amplifiers 13/14 are "Styp"; An allowable minimum value of the control sensitivity is "Smin"; An allowable maximum value of the control sensitivity is "Smax"; A DAC step number per 1 control step is "DS"; and these items corresponding to the first/second variable power amplifiers 13/14 are denoted by suffixes "_GCA1"and "_GCA2".

In this case, for example, when the variable power control operation of 1 [dB] per 1 control step is carried out, while the DAC step number of 4 is entered to the first variable power amplifier and the DAC step number of 5 is entered to the second variable power amplifier, both the first and second variable power amplifiers are controlled in the parallel manner. As a consequence, while such high control sensitivities are not required for the respective variable power amplifiers, the precision of the increased/decreased power per 1 control step can be furthermore improved.

(3) [Variable amplification by variable amplifier 16 is additionally provided with first/second variable power amplifies 13/14].

As previously explained, as to the output noise of the active element, the smaller the input noise thereof become, the easier this output noise is adversely influenced by the noise figure (NF). Accordingly, the variable amplifier 16 is provided at the prestage of the modulation unit 15 so as to increase the value of the unmodulated baseband signal, so that the carrier-to-noise ratio (C/N) can be furthermore improved.

Figure 15:
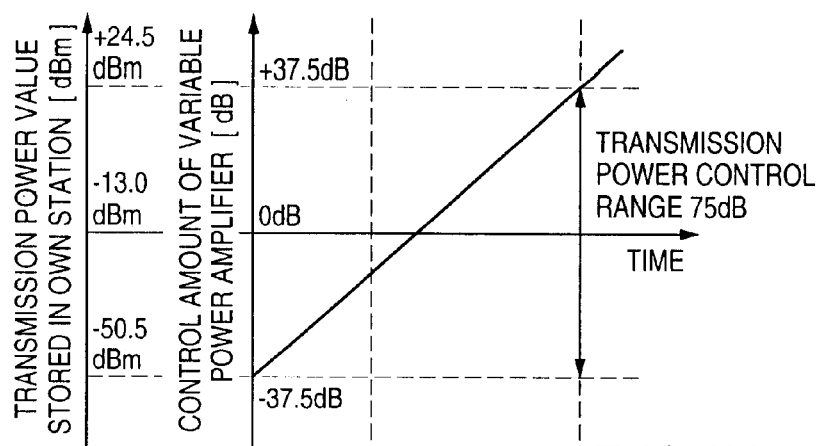
FIG. 15 is a characteristic diagram for explaining a control content in the case that a variable amplifier is provided at a prestage of a modulation unit.
Figure 15:
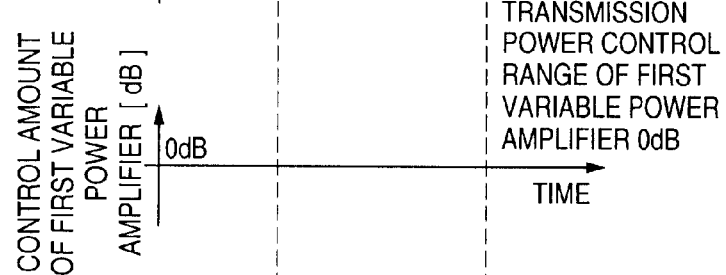
Figure 15:
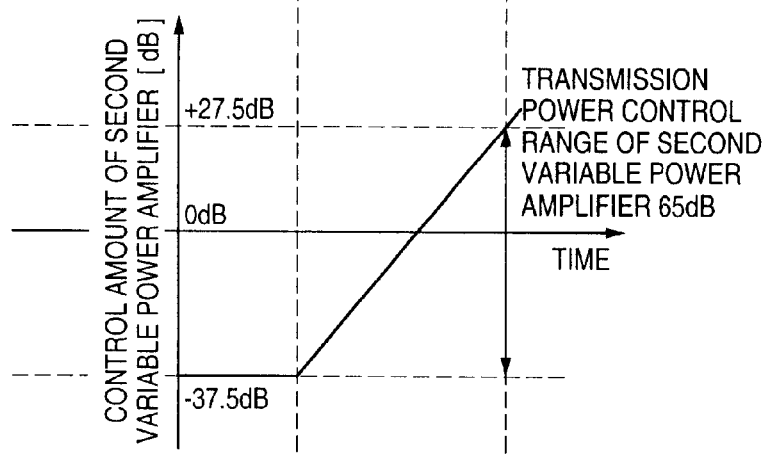
Figure 15:
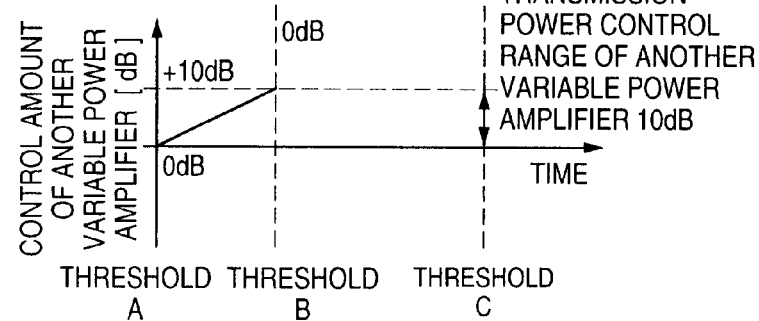
Figure 16:
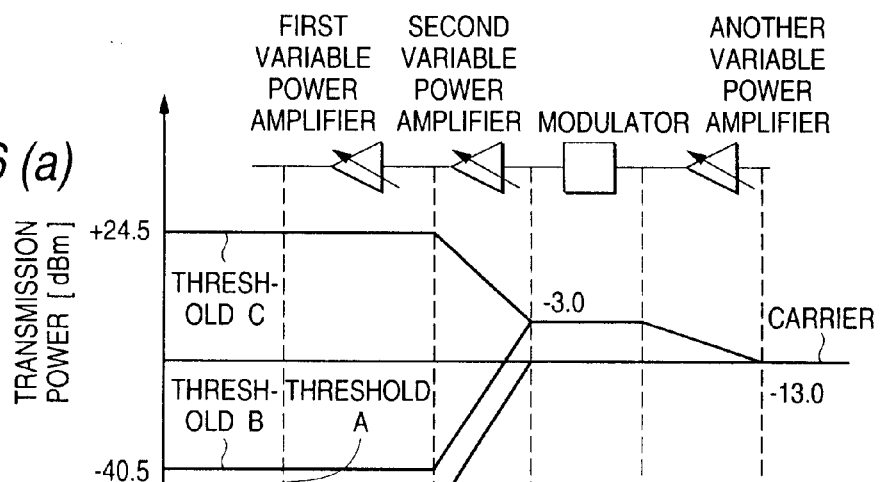
FIG. 16 is a characteristic diagram for representing both the carrier and the noise in the control content of FIG. 15.
Figure 16:
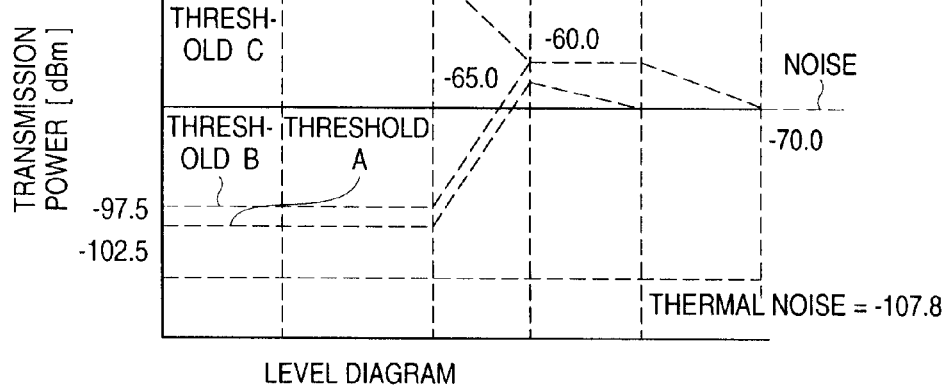
Figure 17:
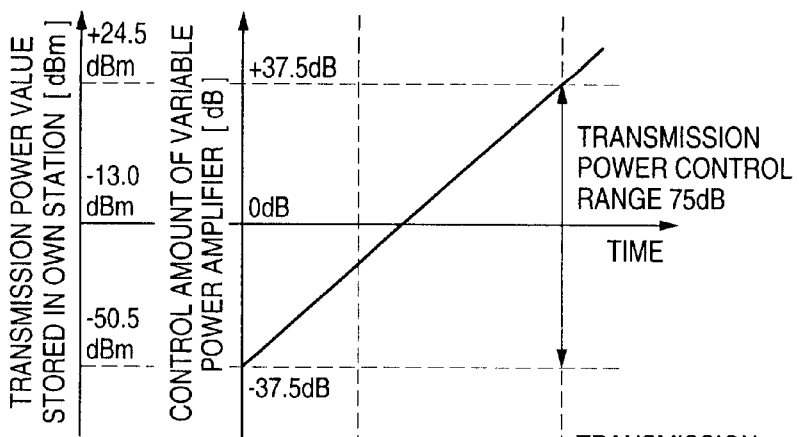
FIG. 17 is a characteristic diagram for explaining a general control example with respect to the control content of FIG. 15.
Figure 17:
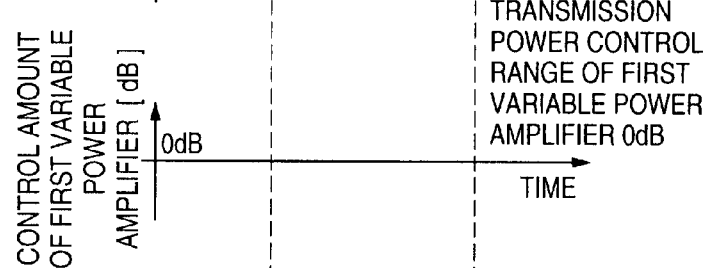
Figure 17:
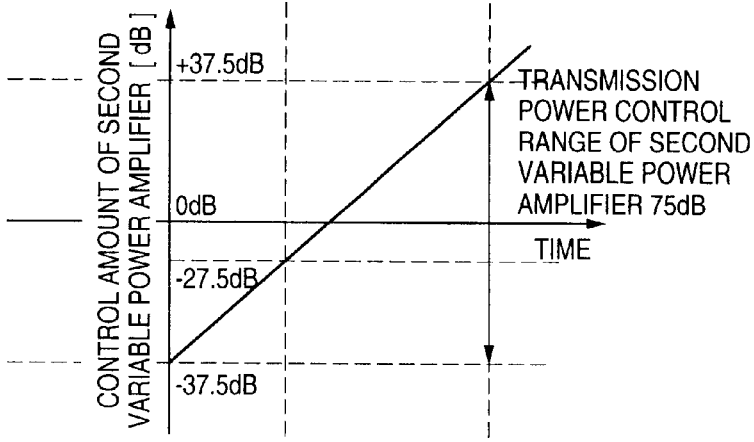
Figure 17:
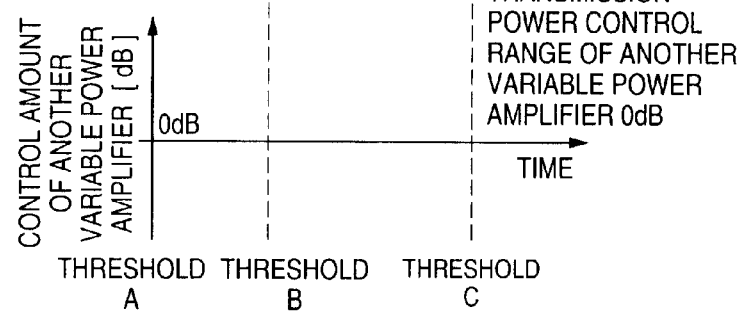
Figure 18:
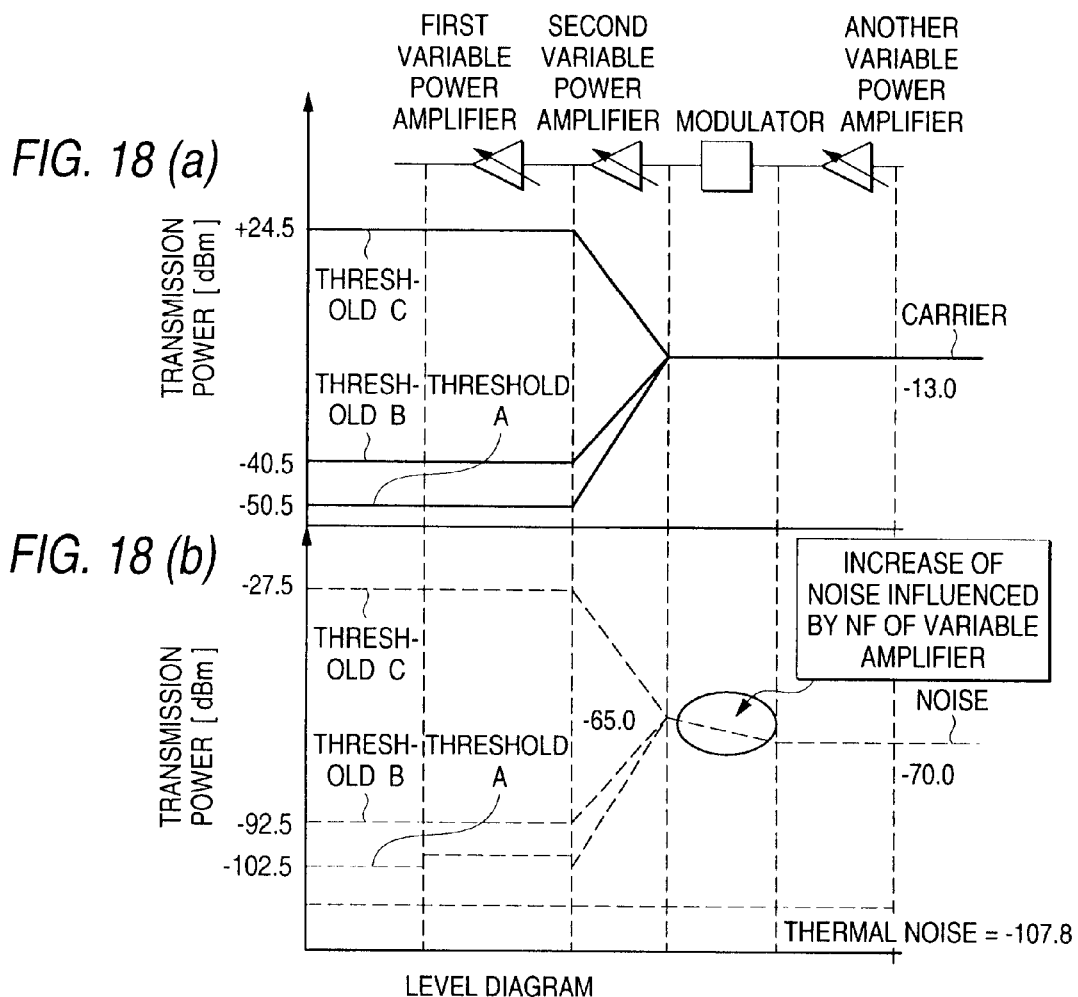
FIG. 18 is a characteristic diagram for explaining a general control example with respect to the control content of FIG. 17.
Figure 19:
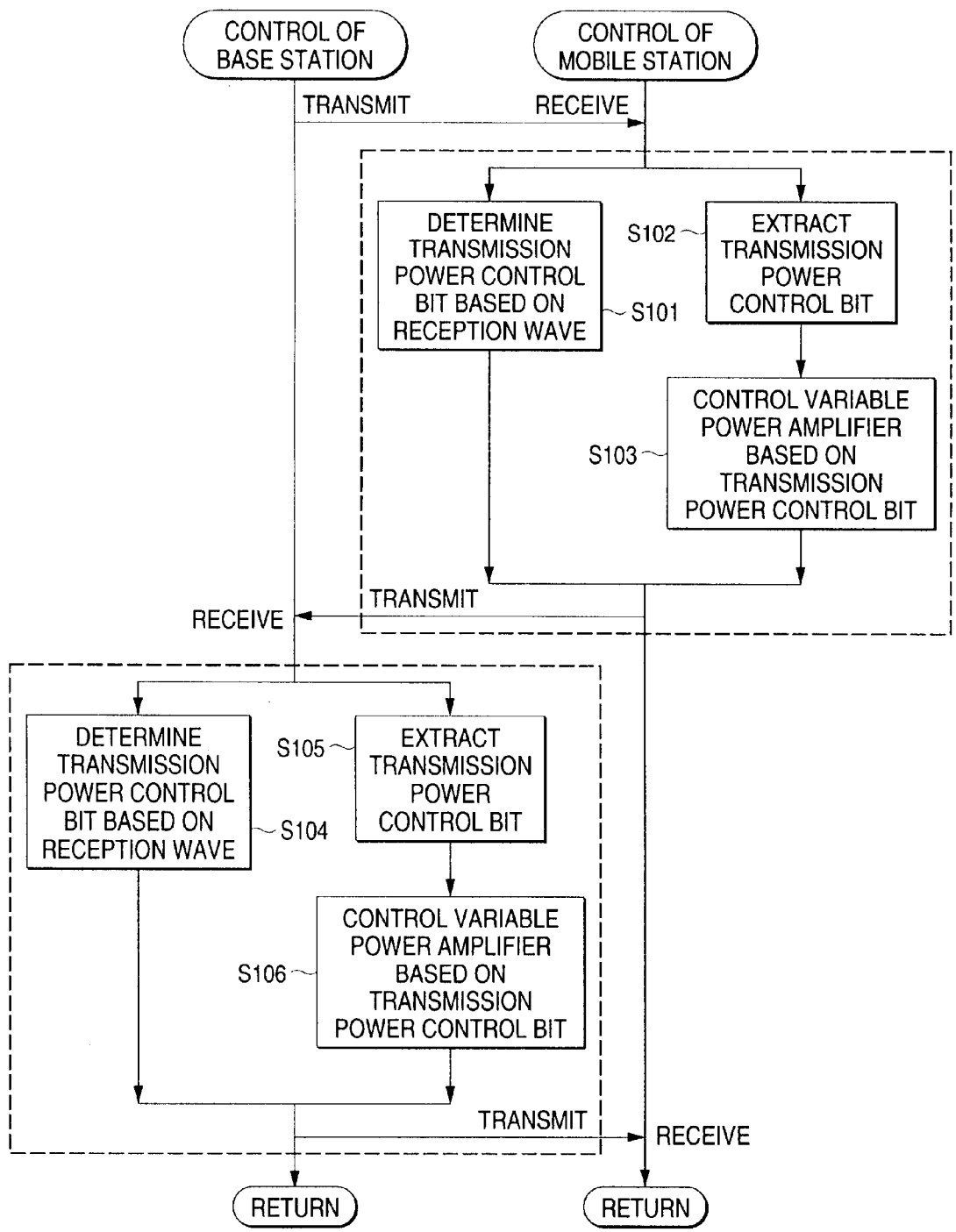
FIG. 19 is a flow chart for describing one example of the conventional transmission power control method.

FIG. 15 and FIG. 16 are diagrams for explaining control contents in the case that the variable amplifier 16 is provided at the prestage of the modulation unit 15. FIG. 17 and FIG. 18 are diagrams for explaining the general control example with respect to the control operations of FIG. 15 and FIG. 16.

In this case, the following conditions are exemplified: A predetermined transmission power control range=75 [dB], a control amount of the first variable power amplifier 13=0 [dB]; a control amount of the second variable power amplifier 14=65 [dB]; and a control amount of the variable amplifier 16=10 [db]; and furthermore, these amplifiers are controlled in the serial control manner in contrast to the above-described preselected control range of the overall variable power amplification of FIG. 3=95 [dB] (predetermined transmission power control range=75 [dB], temperature fluctuation absorption range=+5 and −5 [dB], and component/frequency fluctuation absorption range=+5 and −5 [dB]).

Part (a) of FIG. 15 is a diagram for explaining a control content of an overall variable power amplifying-controlling operation corresponding to part (b) of FIG. 3(*a*); part (b) of FIG. 15 is a diagram for explaining a control content of the first variable power amplifier 13 corresponding to part (b) of FIG. 3; and part (c) of FIG. 15 is a diagram for explaining a control content of the second variable power amplifier 14 corresponding to part (c) of FIG. 3. Also, part (d) of FIG. 15 is a diagram for explaining a control content of the variable amplifier 16, in which the variable amplifier 16 is controlled from 0 [dB] up to 10 [dB] between a threshold value "A" and a threshold value "B". Part (a) and (b) of FIG. 16 represents transmission power [dBm] and levels in the first and second variable amplifiers 13 and 14. Part (a) corresponds to the carrier, and part (b) corresponds to the noise.

Also, FIG. 17 and FIG. 18 are diagrams for explaining control contents of general control examples, which correspond to those of FIG. 15 and FIG. 16, respectively. In this case, no control by the variable amplifier 16 is not carried out. In the control content shown in FIG. 17, in the modulation, the input noise is decreased, and the noise is increased due to the adverse influence of the noise figure. As a result, the C/N would be deteriorated. To the contrary, in the control content of FIG. 15, as indicated in FIG. 16, the C/N can be kept under better condition over the entire control range without being adversely influenced by the noise figure.

It should be understood that when the variable amplifier 16 is controlled in a parallel manner with respect to the first and second variable power amplifiers 13 and 14, and also a plurality of variable amplifiers 16 are employed to be controlled in a parallel manner, since the allowable precision of the variable amplifier 16 can be lowered similar to the first and second variable power amplifiers 13 and 14, the radio communication apparatus can be made simple and compact.

Returning back to FIG. 2, the base station similarly receives the transmission electromagnetic wave sent from the mobile station, and determines a transmit power control bit based upon reception power of this reception electromagnetic wave (step S31). Then, the base station inserts this transmission power control bit into a transmission signal, and then, transmits this resulting transmission signal to the mobile station. On the other hand, the mobile station receives the transmission electromagnetic wave sent from the base station, and then, extracts the transmission power control bit from this reception signal (step S22). The base station updates a value of transmission power stored in the own station based upon the value of this extracted transmission power control bit (step S23). Next, the mobile station compares this updated transmission power value with a preselected threshold value (step S24). Based upon this comparison result, the base station controls the first and second variable power amplifiers 13 and 14, and the variable amplifier 16 (step S25).

At this step S26 similar to the above step S35, since the mobile station controls the first and second variable power amplifiers 13 and 14, and the variable amplifier 16 based upon the value of the transmission power, the linearity within the control range can be improved. Accordingly, the precision in the transmission power control operation can be improved. Also, as previously described, since the structure of the variable power amplifier can be made simple by controlling the variable power amplifiers in the serial control manner, or the parallel control manner, the C/N can be improved in the mobile station, and also the radio communication apparatus can be made simple, compact, and in low cost, which is similar to the base station. Also, the circuit scale of this communication apparatus can be reduced, and the circuit arrangement thereof can be made simple and compact. Therefore, the portability of this communication apparatus can be improved and the power consumption thereof can be suppressed.

As previously described, in accordance with the radio communication apparatus of this embodiment, since the linearity within the variable power control range is improved as well as the precision in the transmission power control operation is improved, it is possible to realize the high-precision transmission power control operation with the high linearity over the wide dynamic range. Also, since the first/second variable power amplifiers 13/14 and the variable amplifier 16 are controlled in either the serial control manner or the parallel control manner, the carrier-to-noise ratio (C/N) can be improved, and further, the radio communication apparatus can be made simple and compact. When this radio communication apparatus is employed in the mobile station, since the apparatus can be made compact, the portability thereof can be improved and furthermore, the power consumption thereof can be reduced.

It should be understood that two sets of variable power amplifiers and one set of variable power amplifier have been employed in the above-explained embodiment, the present invention is not limited thereto. Alternatively, more than 3 sets of variable power amplifiers may be employed, and more than 2 sets of variable amplifiers may be employed. Alternatively, while more than 2 sets of variable power amplifiers and preferably, more than 1 sets of variable amplifier may be additionally provided, these amplifiers may be arbitrarily combined with each other in the parallel control manner, or the serial control manner, otherwise in both the serial/parallel control manners.

As previously described, in accordance with the present invention, a plurality of variable power amplifying means are controlled in either the serial control manner or the parallel control manner over the entire control range, and are controlled by the variable amplifying-controlling manner. As a result, it is possible to realize the transmission power control means with the simple arrangement and operable under low power consumption. It is also possible to provide the compact radio communication apparatus operable under low power consumption, and also to provide the transmission power control method for the radio communication apparatus, while improving the precision in the transmission power control operation.

Also, the serial control manner is carried out with respect to a plurality of variable power amplifying means over the entire control range, or the parallel control manner is carried out with respect to a plurality of variable power amplifying means over the entire control range based upon the comparison result between the own transmission power stored thereinto and a predetermined threshold value. As a result, the linearity within the control range can be improved, the carrier-to-noise ratio of the transmission signal in the radio communication apparatus can be improved, and the radio communication apparatus can be made simple, compact, and furthermore, can be operated under low power consumption, as compared with such a general control operation case that a single variable power amplifying means is controlled.

Also, while the variable amplifier is furthermore provided at the prestage of the plural variable power amplifying means, the serial, or parallel variable amplifying-controlling operation is additionally performed for this variable amplifier among the plural variable power amplifying means. As a result, the carrier-to-noise ratio can be furthermore improved.

What is claimed is:

1. A radio communication apparatus having a transmission power control function capable of controlling transmission power to a communication counter station, comprising:

a plurality of variable power amplifying means for amplifying transmission power; and variable power amplifying-controlling means for controlling said plurality of variable power amplifying means, said variable power amplifier means having:

a serial control manner of controlling said plurality of variable power amplifying means; and a parallel control manner of controlling said plurality of variable power amplifying means;

wherein said controlling is over an entire control range to thereby perform a variable amplifying-controlling operation.

2. A radio communication apparatus as claimed in claim 1, wherein said variable power amplifying-controlling means compares own transmission power stored thereinto with a predetermined threshold value, and then, performs the serial control manner with respect to said plurality of variable power amplifying means over the entire control range based upon said comparison result.

3. A radio communication apparatus as claimed in claim 1, wherein said variable power amplifying-controlling means includes:

control bit extracting means for extracting a transmission power control bit transmitted from a communication counter station;

transmission power storing means for updating the own transmission power stored thereinto based upon said transmission power control bit;

comparing means for comparing said own transmission power stored thereinto with a predetermined threshold value; and controlling-outputting means for sending out a control signal to said plurality of variable power amplifying means based upon said comparison result so as to perform the serial control manner with respect to said plurality of variable power amplifying means over the entire control range.

4. A radio communication apparatus as claimed in claim 1, wherein said variable power amplifying-controlling means includes:
   control bit extracting means for extracting a transmission power control bit transmission power control bit transmitted from a communication counter station;
   transmission power storing means for updating the own transmission power stored thereinto based upon said transmission power control bit; and
   controlling-outputting means for sending out a control signal to said plurality of variable power amplifying means based upon said own transmission power stored thereinto so as to perform the serial control manner with respect to said plurality of variable power amplifying means over the entire control range.

5. A radio communication apparatus as claimed in claim 1, wherein said plurality of variable power amplifying means includes two variable power amplifiers series-connected to each other, and said variable power amplifying-controlling means performs the variable amplifying-controlling operation in either the serial control manner or the parallel control manner over the entire control range with respect to said two variable power amplifiers.

6. A radio communication apparatus as claimed in claims 1, further comprising a variable amplifier positioned at a prestage of said plurality of variable power amplifying means;
   wherein said variable power amplifying-controlling means further performs the variable amplifying-controlling operation in either the serial manner or the parallel manner among said variable power amplifying means with respect to said variable amplifier.

7. A radio communication apparatus as claimed in claims 2, further comprising a variable amplifier positioned at a prestage of said plurality of variable power amplifying means;
   wherein said variable power amplifying-controlling means further performs the variable amplifying-controlling operation in either the serial manner or the parallel manner among said variable power amplifying means with respect to said variable amplifier.

8. A radio communication apparatus as claimed in claims 3, further comprising a variable amplifier positioned at a prestage of said plurality of variable power amplifying means;
   wherein said variable power amplifying-controlling means further performs the variable amplifying-controlling operation in either the serial manner or the parallel manner among said variable power amplifying means with respect to said variable amplifier.

9. A radio communication apparatus as claimed in claims 4, further comprising a variable amplifier positioned at a prestage of said plurality of variable power amplifying means;
   wherein said variable power amplifying-controlling means further performs the variable amplifying-controlling operation in either the serial manner or the parallel manner among said variable power amplifying means with respect to said variable amplifier.

10. A radio communication apparatus as claimed in claims 5, further comprising a variable amplifier positioned at a prestage of said plurality of variable power amplifying means;
   wherein said variable power amplifying-controlling means further performs the variable amplifying-controlling operation in either the serial manner or the parallel manner among said variable power amplifying means with respect to said variable amplifier.

11. A transmission power control method used in a radio communication apparatus, for controlling transmission power to a communication station, comprising:
   a variable power amplifying-controlling step for controlling a plurality of variable power amplifying means over an entire control range, said variable power amplifying step having a serial manner of performing a variable amplifying-controlling operation; and
   a parallel manner of performing the variable amplifying-controlling operation.

12. A transmission power control method as claimed in claim 11, wherein in said variable power amplifying-controlling step, own transmission power stored thereinto is compared with a predetermined threshold value, and then, the serial control manner with respect to said plurality of variable power amplifying means is performed over the entire control range based upon said comparison result.

13. A transmission power control method as claimed in claim 11, wherein said variable power amplifying-controlling step includes:
   a control bit extracting step for extracting a transmission power control bit transmitted from a communication counter station;
   a transmission power storing step for updating the own transmission power stored thereinto based upon said transmission power control bit;
   a comparing step for comparing said own transmission power stored thereinto with a predetermined threshold value; and
   a controlling-outputting step for sending out a control signal to said plurality of variable power amplifying means based upon said comparison result so as to perform the serial control manner with respect to said plurality of variable power amplifying means over the entire control range.

14. A transmission power control method as claimed in claim 11, wherein said variable power amplifying-controlling step includes:
   a control bit extracting step for extracting a transmission power control bit transmitted from a communication counter station;
   a transmission power storing step for updating the own transmission power stored thereinto based upon said transmission power control bit; and
   a controlling-outputting step for sending out a control signal to said plurality of variable power amplifying means based upon said comparison result so as to perform the serial control manner with respect to said plurality of variable power amplifying means over the entire control range.

15. A transmission power control method as claimed in claim 11, wherein, in said variable power amplifying-controlling step, the variable amplifying-controlling operation is carried out in either the serial control manner or the parallel manner among said variable power amplifying means with respect to a variable amplifier provided at a prestage of said plurality of variable power amplifying means.

16. A transmission power control method as claimed in claim 12, wherein, in said variable power amplifying-controlling step, the variable amplifying-controlling operation is carried out in either the serial control manner or the parallel manner among said variable power amplifying means with respect to a variable amplifier provided at a prestage of said plurality of variable power amplifying means.

17. A transmission power control method as claimed in claim 13, wherein, in said variable power amplifying-controlling step, the variable amplifying-controlling operation is carried out in either the serial control manner or the parallel manner among said variable power amplifying means with respect to a variable amplifier provided at a prestage of said plurality of variable power amplifying means.

18. A transmission power control method as claimed in claim 14, wherein, in said variable power amplifying-controlling step, the variable amplifying-controlling operation is carried out in either the serial control manner or the parallel manner among said variable power amplifying means with respect to a variable amplifier provided at a prestage of said plurality of variable power amplifying means.

* * * * *

UNITED STATES PATENT AND TRADEMARK OFFICE
CERTIFICATE OF CORRECTION

PATENT NO. : 6,675,000 B1
DATED : January 6, 2004
INVENTOR(S) : Ichikawa, Yasufumi It is certified that error appears in the above-identified patent and that said Letters Patent is hereby corrected as shown below:

Column 3,
Line 4, "...and variable:...", should be -- ...and variable... --;

Column 6,
Line 38, "...system of: the radio...", should be -- ...system of the radio... --;

Column 7,
Line 10, "...owns an: extract...", should be -- ...owns an extract... --;

Column 8,
Line 48, "...range++5[db];...", should be -- ...range = +5[db];... --.

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,675,000 B1
DATED : January 6, 2004
INVENTOR(S) : Ichikawa, Yasufumi It is certified that error appears in the above-identified patent and that said Letters Patent is hereby corrected as shown below:

Column 3,
Line 4, "...and variable:...", should be -- ...and variable... --;

Column 6,
Line 38, "...system of: the radio...", should be -- ...system of the radio... --;

Column 7,
Line 10, "...owns an: extract...", should be -- ...owns an extract... --;

Column 8,
Line 48, "...range++5[db];...", should be -- ...range = ±5[db];... --.

This certificate supersedes Certificate of Correction issued May 18, 2004.

Signed and Sealed this

Ninth Day of May, 2006

JON W. DUDAS
*Director of the United States Patent and Trademark Office*